United States Patent [19]

Suda et al.

[11] Patent Number: 5,200,800
[45] Date of Patent: Apr. 6, 1993

[54] POSITION DETECTING METHOD AND APPARATUS

[75] Inventors: Shigeyuki Suda; Kenji Saitoh, both of Yokohama; Minoru Yoshii, Tokyo; Noriyuki Nose, Machida, all of Japan

[73] Assignee: Canon Kabushiki Kaisha, Tokyo, Japan

[21] Appl. No.: 892,732

[22] Filed: May 29, 1992

Related U.S. Application Data

[63] Continuation of Ser. No. 692,932, Apr. 29, 1991, abandoned.

[30] Foreign Application Priority Data

May 1, 1990 [JP] Japan .................................. 2-115447
Jun. 1, 1990 [JP] Japan .................................. 2-143869

[51] Int. Cl.⁵ .......................................... G01B 11/00
[52] U.S. Cl. .................................... 356/401; 250/548; 355/53
[58] Field of Search ...................... 356/399, 400, 401; 250/548, 557; 355/53, 77

[56] References Cited

U.S. PATENT DOCUMENTS

| | | | |
|---|---|---|---|
| 4,037,969 | 7/1977 | Feldman et al. | 250/237 G |
| 4,311,389 | 1/1982 | Fay et al. | 356/354 |
| 4,360,273 | 11/1982 | Thaxter | 356/354 |
| 4,617,469 | 10/1986 | Takahashi et al. | 250/548 |
| 4,655,599 | 4/1987 | Ayata et al. | 356/400 |
| 4,853,745 | 8/1989 | Kamiya et al. | 355/43 |
| 4,962,423 | 10/1990 | Yamada et al. | 358/101 |
| 5,028,797 | 7/1991 | Abe et al. | 250/548 |
| 5,114,235 | 5/1992 | Suda et al. | 356/401 |

FOREIGN PATENT DOCUMENTS 0358425   9/1989  European Pat. Off. .
0336537A1 10/1989  European Pat. Off. .
56-157033 12/1981  Japan .

Primary Examiner—F. L. Evans
Attorney, Agent, or Firm—Fitzpatrick, Cella, Harper & Scinto

[57] ABSTRACT

A method of detecting a position of a substrate having an alignment mark includes the steps of projecting a radiation beam from an optical head to the alignment mark such that the alignment mark produces a signal beam on the basis of which the position of the substrate is detected, forming a reference mark on the substrate at a position different from that of the alignment mark, projecting a radiation beam from the optical head to the reference mark, such that the reference mark produces a reference beam, detecting the relative positional deviation of the optical head relative to the reference mark on the basis of the produced reference beam, and adjusting the relative position of the optical head and the alignment mark on the basis of the detected relative positional deviation and, after the adjustment, detecting the position of the substrate on the basis of the produced signal beam.

21 Claims, 20 Drawing Sheets

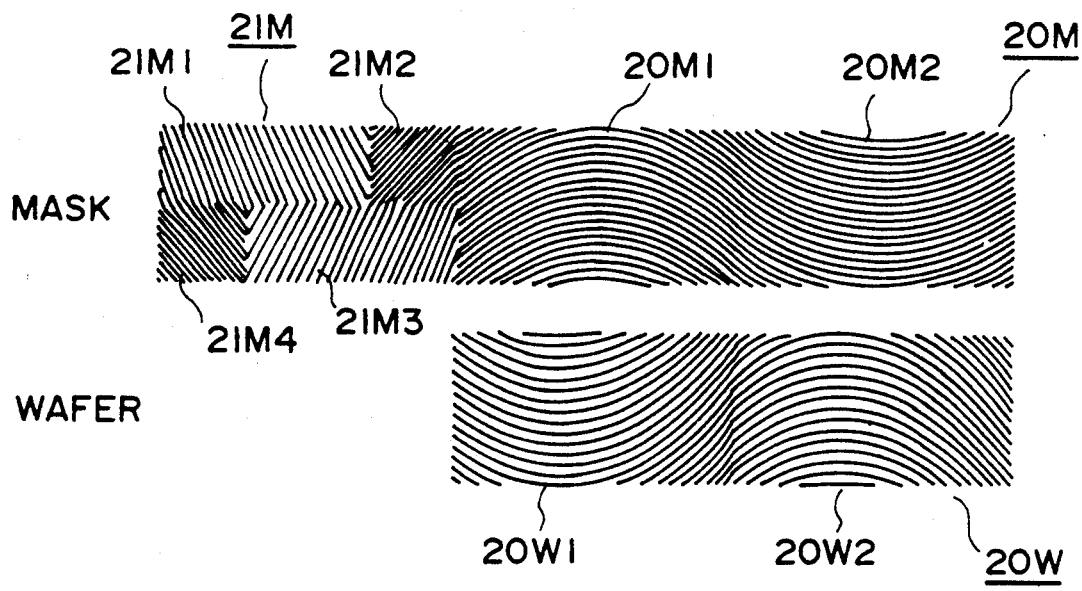
F I G. 13
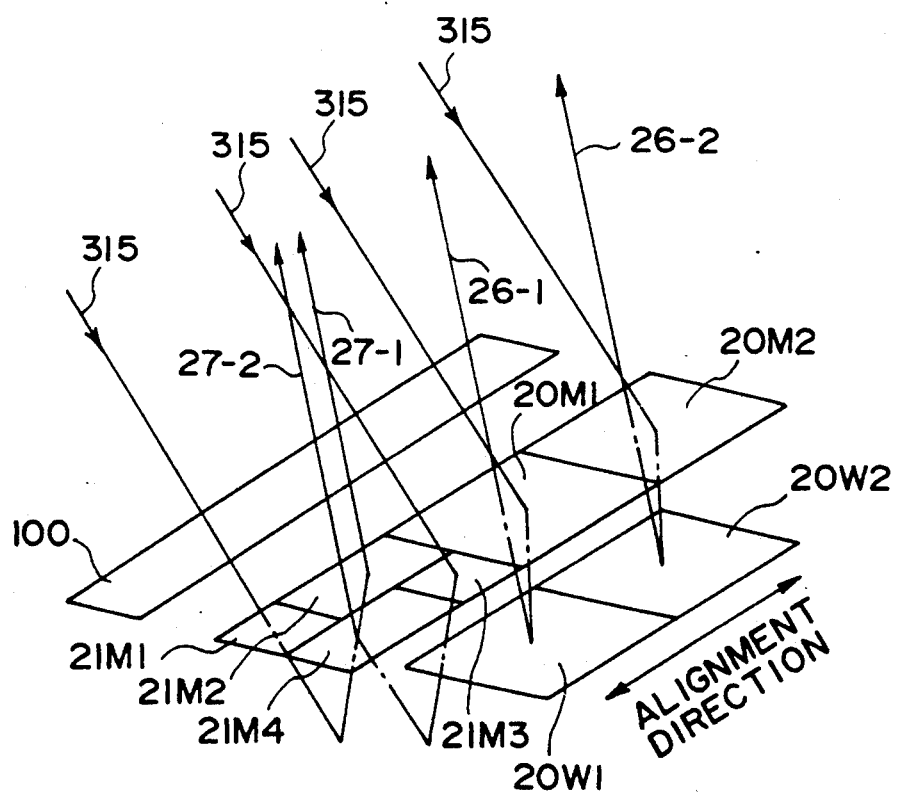
F I G. 14

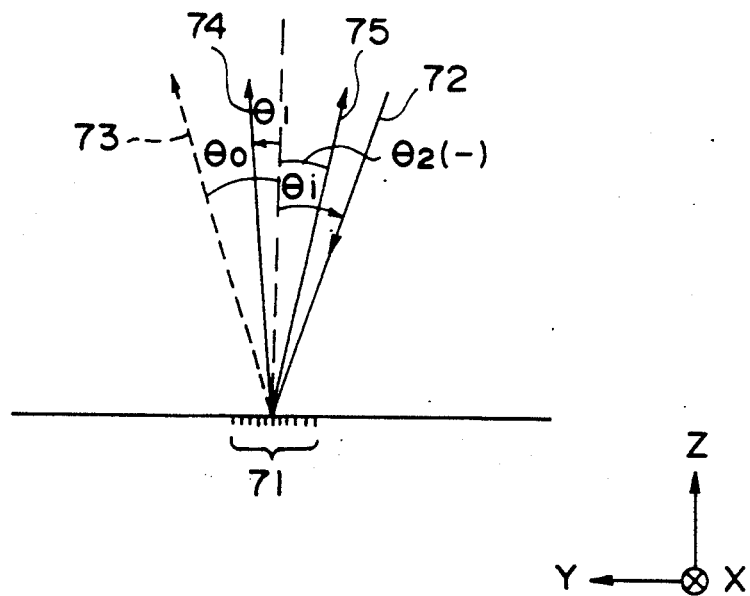
FIG. 18
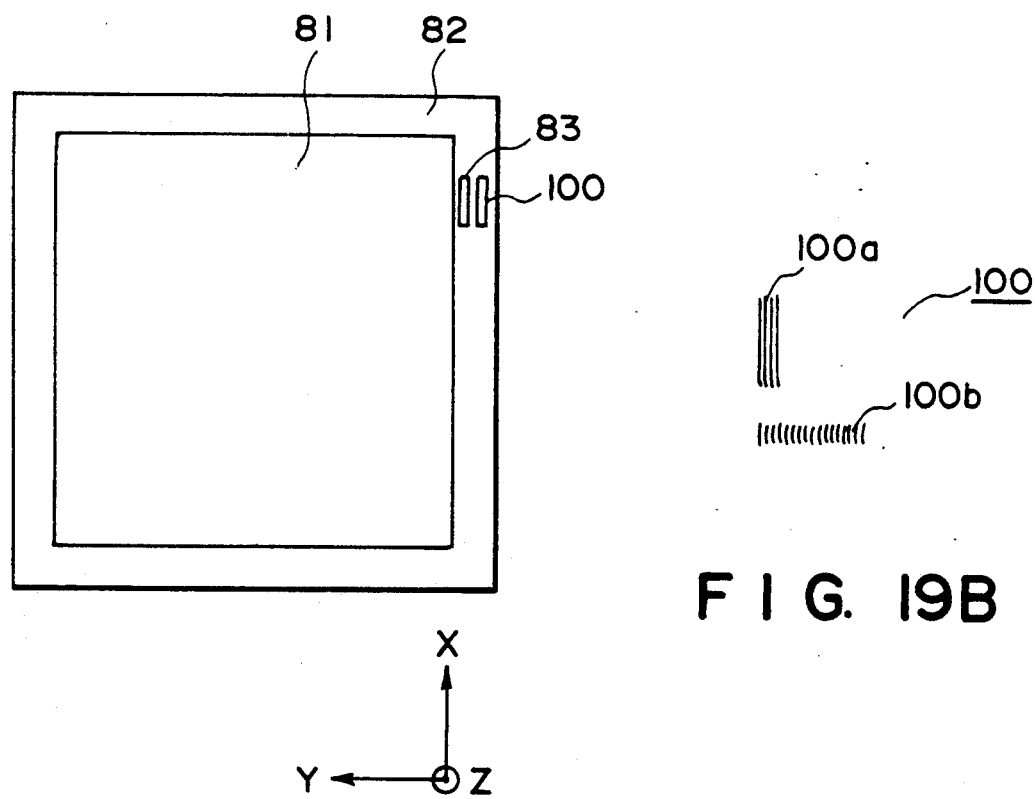
FIG. 19B
FIG. 19A

POSITION DETECTING METHOD AND APPARATUS

This application is a continuation of application Ser. No. 07/692,932 filed Apr. 29, 1991, now abandoned.

FIELD OF THE INVENTION AND RELATED ART

This invention relates generally to an alignment system for correctly positioning an object. More particularly, the invention is concerned with a position detecting method and apparatus suitably usable in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relative positioning or aligning of the mask and the wafer.

In exposure apparatuses for use in the manufacture of semiconductor devices, the relative alignment of a mask and a wafer is one important factor for ensuring improved performance. Particularly, as for alignment systems employed in recent exposure apparatuses, submicron alignment accuracies or more strict accuracies are required to satisfy the demand for higher degree of integration of semiconductor devices.

In many types of alignment systems, features called "alignment patterns" or "alignment marks" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. No. 4,037,969 and Japanese Laid-Open Patent Application, Laid-Open No. Sho 56-157033, wherein so-called zone plates are used as alignment patterns upon which light is projected and wherein the positions of light spots formed on a predetermined plane by light from the illuminated zone plates are detected.

U.S. Pat. No. 4.311.389 shows an arrangement wherein a mask is equipped with an alignment pattern having an optical function, for diffraction light, like a cylindrical lens while a wafer is equipped with an alignment pattern of a dot array with which the light quantity of diffraction light of a predetermined order or orders from the pattern becomes a maximum as the mask and the wafer are in correct alignment with each other, and wherein the relative position of the mask and the wafer is detected by detecting the light influenced by these alignment patterns.

European Patent Application No. 0,336,537A1 shows an arrangement wherein, for detection of the relative positional deviation between a first object (mask) and a second object (wafer), each of the first and second objects is equipped with a pair of physical optic elements (alignment marks) each having a lens function. Light is projected to these physical optic elements from a light projecting means, including a laser, and a pair of diffraction lights as diffracted by these physical optic elements, respectively, are directed to a sensor (detecting means). By detecting the relative spacing between two light spots formed by the pair of diffraction lights upon the sensor surface, the relative positional deviation of the first and second objects is detected.

Here, the light projecting means as well as a detecting means for receiving the light diffracted by the two sets of physical optic elements, respectively, provided on the first and second objects, are accommodated in one casing.

Generally, a scribe line on a mask or a wafer, on which an alignment mark is to be provided, has a width of about 50–100 microns. This scribe line width corresponds, in a stepper of a projection magnification of 1:5, to a width of 250–500 microns on a reticle surface, and it corresponds in a unit-magnification contact or proximity X-ray exposure apparatus to a width of 50–100 microns. Each alignment mark is provided so as to be included in an area of this width. Thus, each alignment pattern is provided within the scribe line width.

In order to assure that light (light beam) is projected with a good efficiency from an alignment optical head (light projecting means) to an alignment pattern provided in such a small area, it is necessary to restrict the light beam diameter to a size corresponding to that of the alignment pattern. Further, as regards the manner of light projection, it is necessary that the light is projected correctly to the position of the alignment pattern.

Generally, if the light is projected incorrectly to the alignment pattern, the quantity of light (signal light) to be detected by a sensor decreases accordingly. If the light beam diameter is sufficiently large with respect to the size of the alignment pattern, a small deviation of the light with respect to the alignment pattern will be allowed.

However, if the light is projected to a circuit pattern area, other than the alignment pattern area, there occurs unwanted scattered light (noise) from the circuit pattern. In order to avoid this, it is still necessary that the alignment pattern is irradiated with the light of an appropriate size corresponding to the size of the alignment pattern.

Generally, if the light beam diameter is restricted, the light quantity distribution upon the alignment pattern surface on a mask (reticle) becomes non-uniform.

Further, if the position of incidence of the light upon the alignment pattern makes a large shift, in an arrangement such as disclosed in the aforementioned European Patent Application, the position of a spot of diffraction light as attainable from the alignment pattern, (i.e. mask-to-wafer deviation information) in the case where a small deviation is present between the mask and the wafer, is displaced as compared with its position in the case where the position of incidence of the light upon the alignment pattern is not shifted. Namely, the shift of the position of incidence of the light upon the alignment pattern causes an error in the alignment detection (detection of the mask-to-wafer deviation).

Generally, where a laser is used as a light source, the intensity distribution of a projected light beam from an optical head has a Gaussian form such as shown in FIG. 1, as having two symmetrical axes Ix and Iy. The projected light beam is so set that it is approximately a plane wave as it impinges on an alignment mark (pattern). Here, the radius of light beam in the X or Y direction in which the intensity decreases to $e^{-2}$, for example, is denoted by Wx or Wy. In FIG. 1, numeral 13 denotes a laser, a numeral 14 denotes a collimator lens and a character L denotes the light beam.

Here, if the beam radius Wx or Wy is made sufficiently large to cover the alignment mark, with a lowered precision of the relative alignment of the projected light beam and the alignment mark, the intensity distribution of the light impinging on the alignment mark does not easily change. As a result, the spacing between the gravity center positions of the two light spots on the sensor does not easily change and, therefore, the stability increases. However, the efficiency of using the projected light beam (energy) decreases and, therefore, there arise problems such as a decrease in the signal intensity, an increase in the noise component, and the like.

If, to the contrary, the light beam diameter is made small, the signal-to-noise ratio increases. However, since the intensity distribution upon the alignment mark surface becomes non-uniform, any change in the relative position of the projected light beam and the alignment mark causes a change in the intensity distribution of an image as formed by the alignment mark of the mask. As a result, the spacing of the gravity centers of the two light spots on the sensor, formed through the enlarging image formation of that image, changes and the precision decreases.

It is seen therefrom that if the precision of the relative positioning of the projected light beam (i.e. the optical head or light projecting means) and the alignment mark (first or second object) is enhanced and an appropriate diameter of the projected light beam is adopted, the position detecting precision as well as the alignment precision can be enhanced.

However, if the positioning precision for the incidence of the projected light beam upon the alignment mark surface is to be improved only by a mechanical system, the structure becomes bulky and complicated and, as a result, there arises a problem of difficulty in maintaining the stability for a long time period.

SUMMARY OF THE INVENTION

It is accordingly an object of the present invention to provide a position detecting method or apparatus by which high-precision position detection is attainable.

It is another object of the present invention to provide an exposure apparatus which uses such a position detecting method or apparatus.

It is a further object of the present invention to provide a method of manufacturing semiconductor devices, using such a position detecting method.

In accordance with an aspect of the present invention, to achieve at least one of these objects, there is provided in a method of detecting a position of a substrate having an alignment mark, wherein a radiation beam is projected from an optical head to the alignment mark such that the alignment mark produces a signal beam on the basis of which the position of the substrate is detected, the improvements residing in: forming a reference mark on the substrate at a position different from that of the alignment mark; projecting a radiation beam from the optical head to the reference mark, such that the reference mark produces a reference beam; detecting the relative positional deviation of the optical head relative to the reference mark on the basis of the produced reference beam; and adjusting the relative position of the optical head and the alignment mark on the basis of the detected relative positional deviation and, after the adjustment, detecting the position of the substrate on the basis of the produced signal beam.

In accordance with another aspect of the present invention, there is provided a device for detecting a position of a substrate having an alignment mark and a reference mark formed at different positions thereon, the device comprising: an optical head movable along the substrate, for projecting a radiation beam to the substrate and for receiving the radiation beam from the substrate; and control means for controlling the optical head and for detecting the position of the substrate on the basis of a signal from the optical head; wherein the control means is operable to cause the optical head to project a radiation beam to the reference mark of the substrate and also to cause the same to photoelectrically detect the radiation beam from the reference mark, whereby the optical head produces a first signal; wherein the control means is further operable to determine a relative positional deviation of the optical head relative to the reference mark of the substrate on the basis of the first signal from the optical head and also to move the optical head relative to the substrate in accordance with the determination so as to bring the optical head into alignment with the alignment mark of the substrate; wherein the control means is further operable to cause the optical head to project a radiation beam to the alignment mark of the substrate and also to cause the same to photoelectrically detect the radiation beam from the alignment mark of the substrate, whereby the optical head produces a second signal; and wherein the control means is further operable to determine the position of the substrate on the basis of the second signal from the optical head.

In accordance with a further aspect of the present invention, there is provided an alignment and exposure apparatus usable with a mask having a circuit pattern and having a first alignment mark and a reference mark formed at different positions thereon as well as a wafer having a second alignment mark, for exposing the wafer to the circuit pattern of the mask with radiation, the apparatus comprising: a first stage for holding the mask; a second, movable stage for holding the wafer; illumination means for illuminating the mask so that the wafer is exposed to the circuit pattern of the mask as illuminated; an optical head movable along the mask, for projecting a radiation beam to the mask and for receiving the radiation beam from the mask; and control means for controlling the optical head and the second movable stage and for detecting the position of the wafer on the basis of a signal from the optical head; wherein the control means is operable to cause the optical head to project a radiation beam to the reference mark of the mask and also to cause the same to photoelectrically detect a reflection beam from the reference mark, whereby the optical head produces a first signal; wherein the control means is further operable to determine a relative positional deviation of the optical head relative to the reference mark of the mask on the basis of the first signal from the optical head and also to move the optical head relative to the mask in accordance with the determination so as to bring the optical head into alignment with the first alignment mark of the mask; wherein the control means is further operable to cause the optical head to project a radiation beam to the first and second alignment marks of the mask and the wafer and also to cause the same to photoelectrically detect a signal beam from the first and second alignment marks, whereby the optical head produces a second signal; wherein the control means is further operable to determine the relative position of the wafer relative to the mask on the basis of the second signal from the optical head; and wherein the control means is further operable to move the second movable stage in accordance with the determination of the relative position of the wafer, so as to align the wafer with respect to the mask.

In accordance with a still further aspect of the present invention, there is provided a method usable with a mask having a circuit pattern and a first alignment mark as well as a wafer having a second alignment mark, for manufacturing semiconductor devices, by using an optical head, comprising: forming a reference mark on the mask at a position different from that of the first alignment mark; projecting from the optical head a radiation beam to the reference mark of the mark, such that the reference mark produces a reference beam; detecting a relative positional deviation of the optical head relative to the reference mark of the mask on the basis of the produced reference beam; adjusting the relative position of the optical head and the first alignment mark of the mask on the basis of the detection of the relative positional deviation; projecting from the optical head a radiation beam to the first and second alignment marks of the mask and the wafer, such that the first and second alignment marks produce a signal beam; detecting the relative positional deviation of the mask and the wafer on the basis of the produced signal beam; adjusting the relative position of the mask and the wafer on the basis of the detected relative positional deviation of the mask and the wafer; and exposing the wafer to the circuit pattern of the mask with a radiation energy.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 13 and 14 are enlarged views, respectively, for explaining a portion of FIG. 12.

FIG. 18 is a schematic representation, for explaining a diffraction grating.

FIGS. 19A and 19B are schematic representations, for explaining an alignment mark and a reference mark on a mask surface.

DESCRIPTION OF THE PREFERRED EMBODIMENTS

Figure 2:
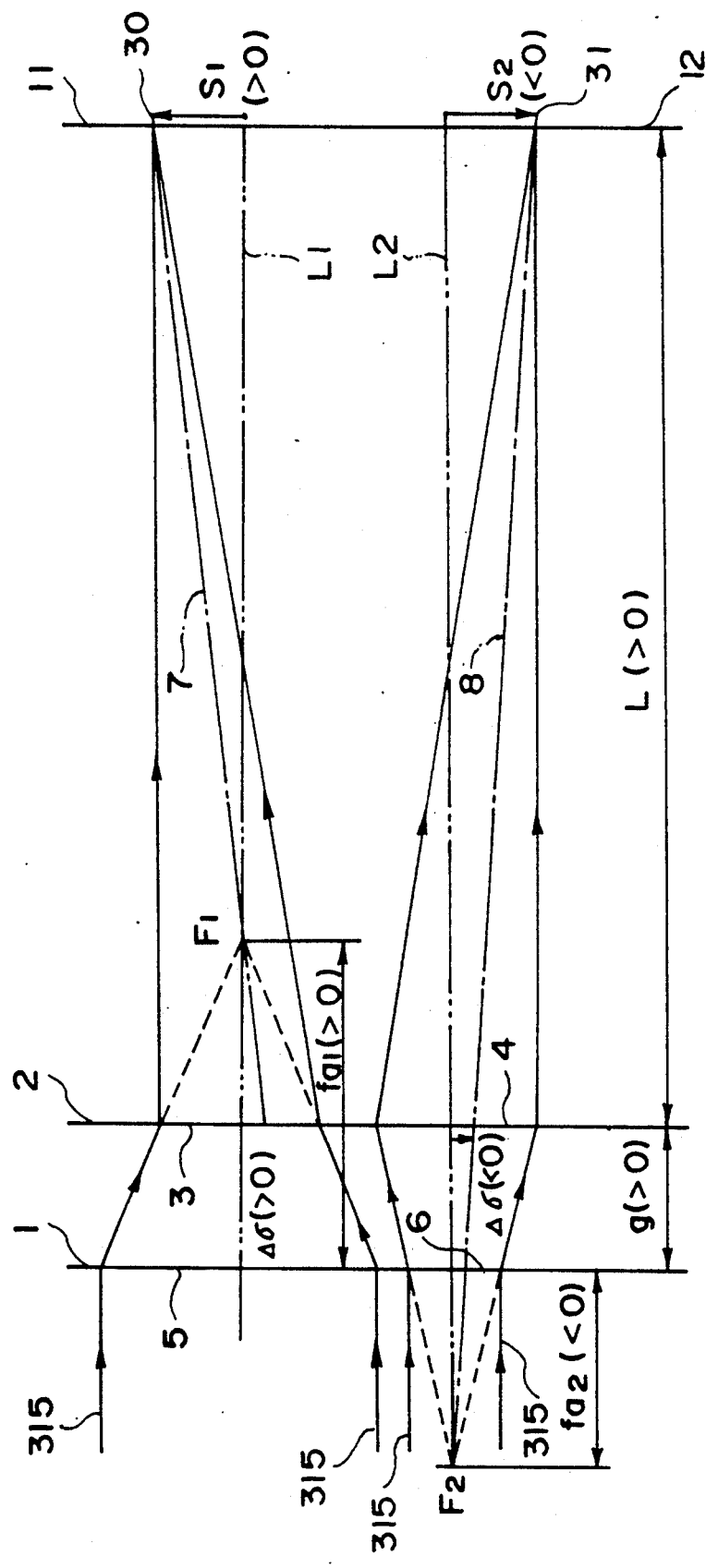
FIG. 2 is a schematic representation, for explaining the principle of position detection in a position detecting device according to the present invention.
Figure 3:
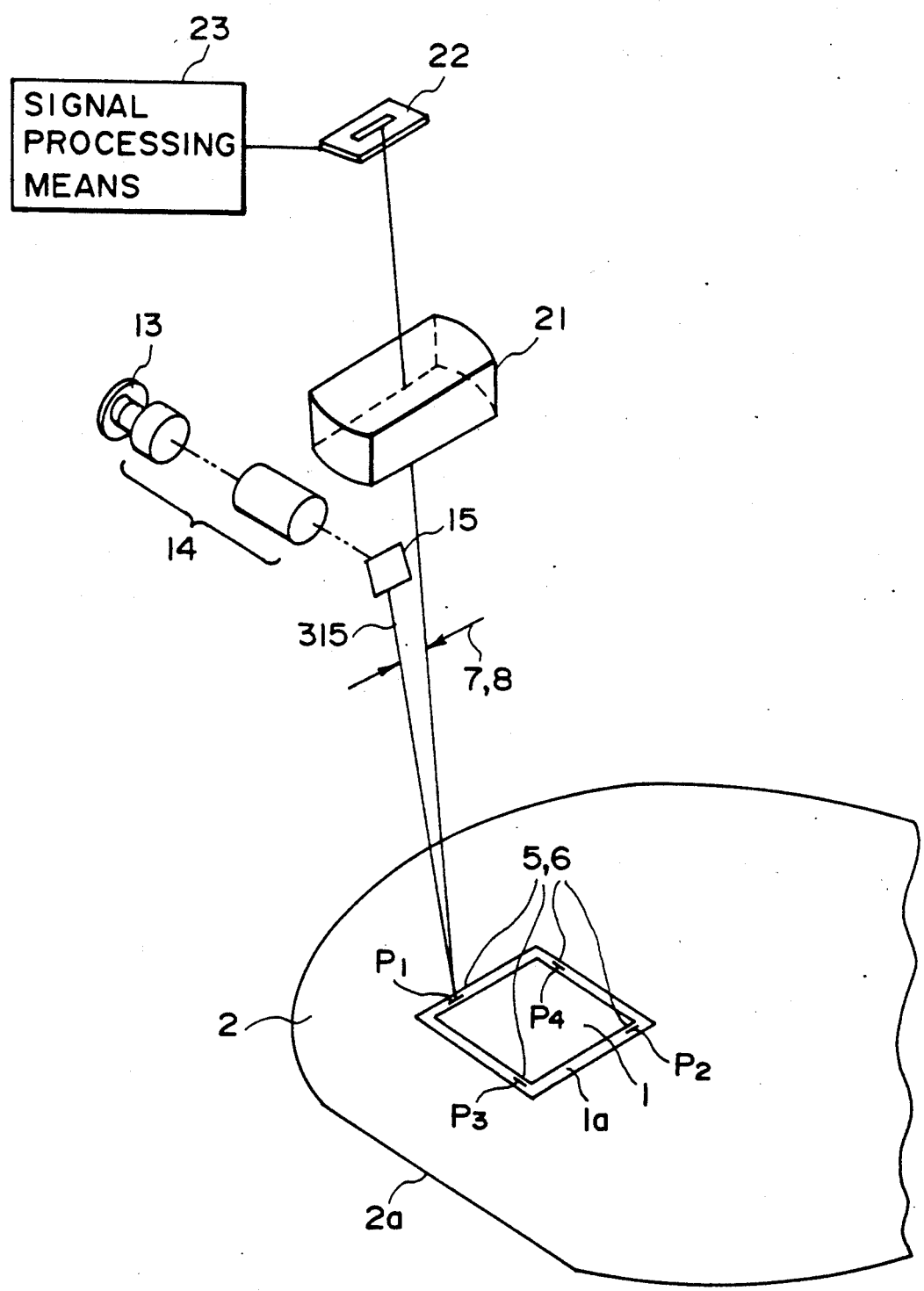
FIGS. 3, 4A and 4B are schematic representations, respectively, showing a major part of an embodiment according to the present invention, which is based on the principle shown in FIG. 2.
Figure 4A:
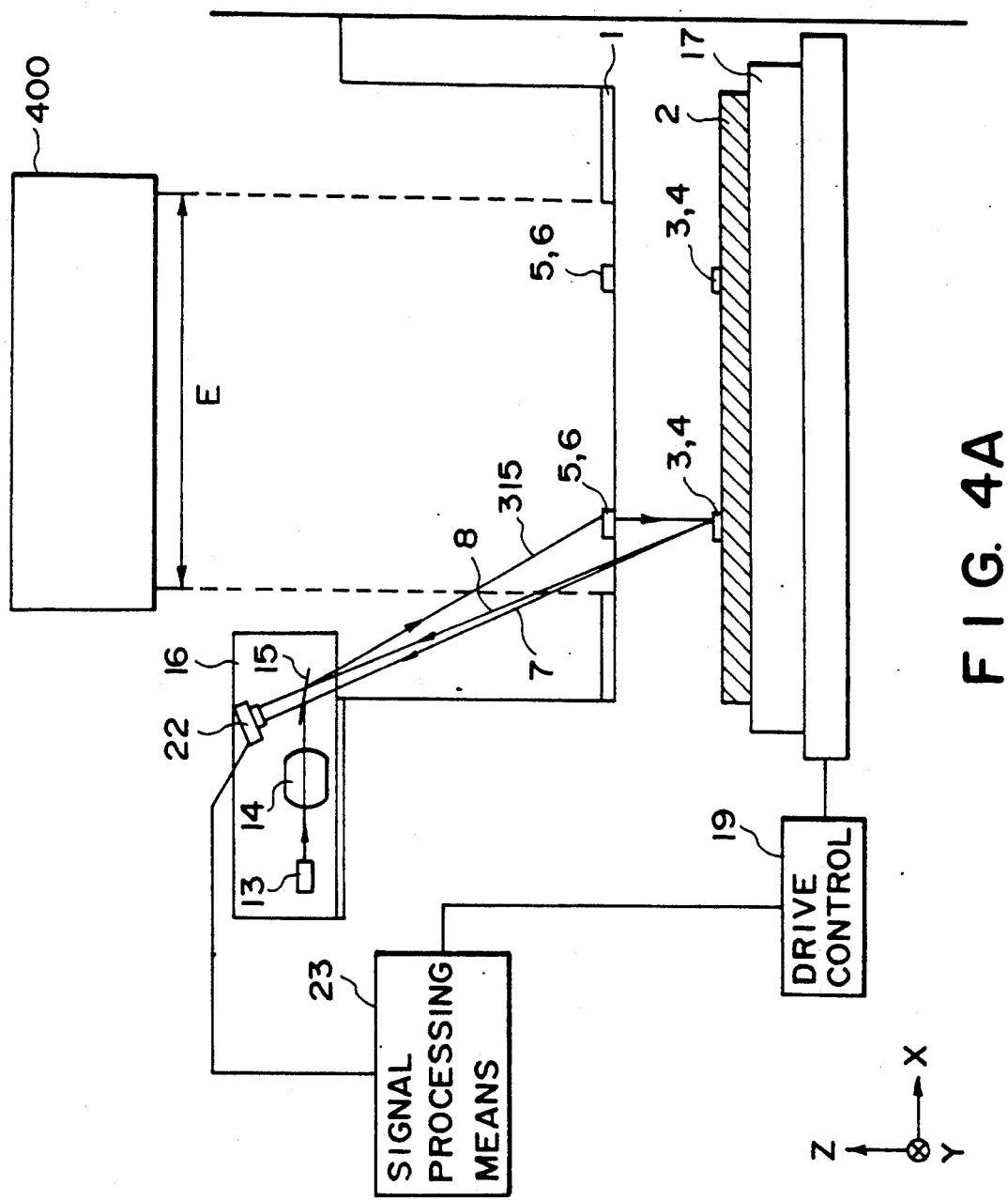
Figure 4B:
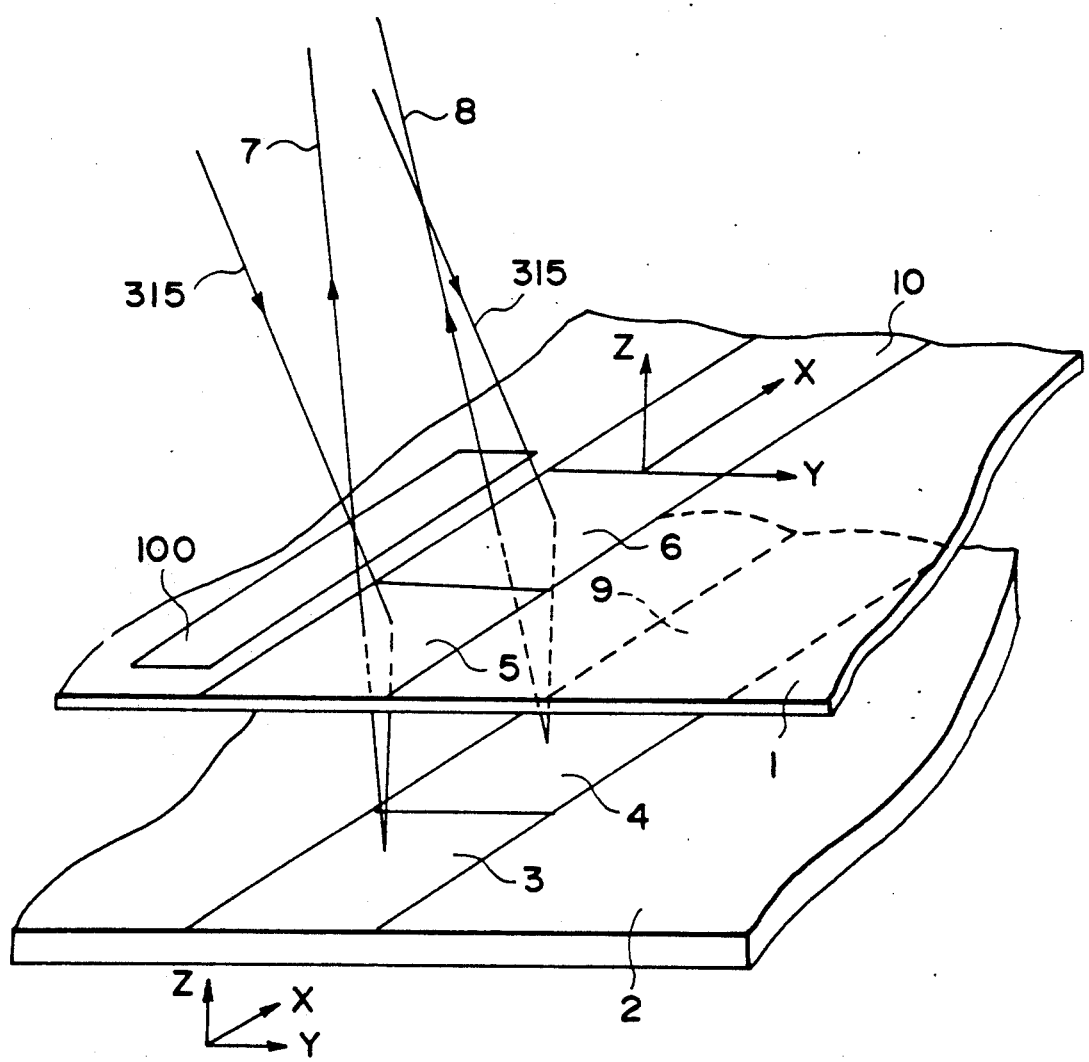

FIG. 2 is a schematic representation for explaining, in an extended view, the principle of position detection as well as the constitutional features of a position detecting device according to the present invention. FIGS. 3, 4A and 4B are a perspective view, a side view and a perspective view, respectively, each showing a major part of a first embodiment of the present invention, which is based on the principle as shown in FIG. 2.

First, a description will be provided of the method of detecting the relative position of first and second objects. In the drawings, denoted at 1 is a first object such as a mask, and denoted at 2 is a second object such as a wafer. Illustrated in FIGS. 2-4B is an instance wherein the relative positional deviation between the first and second objects 1 and 2 is to be detected. Denoted at 5 is an alignment mark provided on the first object 1, and denoted at 3 is an alignment mark provided on the second object 2. These alignment marks are provided so as to obtain a first signal light. Similarly, denoted at 6 is an alignment mark provided on the first object 1, and denoted at 4 is an alignment mark provided on the second object 2, both for obtaining a second signal light. Denoted at 100 is a reference mark which is provided for the detection of the relative position of a light projecting means (optical head) and the first object 1, to be described later.

The reference mark 100 and the alignment marks 3-6 each comprises a physical optic element with or without a one-dimensional or a two-dimensional lens function. They are formed at each of four locations on the first or second object, around a pattern region. Denoted at 9 is a wafer scribe line, and denoted at 10 is a mask scribe line.

Denoted at 315 is an input light, and denoted at 7 and 8 are first and second alignment signal lights. Denoted at 11 and 12 are first and second detecting portions, respectively, for detecting the first and second signal lights. Here, for convenience of explanation, the optical distance from the second object 2 to the first or second detecting portion 11 or 12 is denoted by L. Also, the distance between the first and second objects 1 and 2 is denoted by g, the focal lengths of the alignment marks 5 and 6 are denoted by $f_{a1}$ and $f_{a2}$, respectively, the relative positional deviation between the first and second objects 1 and 2 is denoted by $\Delta\sigma$ and the displacements of the gravity centers of the first and second signal lights on the first and second detecting portions 11 and 12, at this time, from a reference position, are denoted by S1 and S2, respectively. The light 315 incident on the first object 1 comprises a plane wave, for convenience, and the sign is such as illustrated.

Each of the displacements S1 and S2 of the gravity centers of the signal lights can be determined geometrically, as the gravity center position of the signal light with respect to the intersection (reference position) between (i) a straight line L1 (L2) connecting the optical axis centers of the aligned alignment marks 5 and 3 (6 and 4) and (ii) the light receiving surface of the detecting portion 11 (12). Therefore, as will be readily understood from FIG. 2, if the alignment marks 3 and 4 have optical imaging magnifications of opposite signs, the displacements S1 and S2 of the gravity centers of the signal lights, for a relative positional deviation of the first and second objects 1 and 2, are produced in opposite directions.

Quantitatively, they can be expressed as follows:

$$S1 = -[(L-f_{a1}+g)/(f_{a1}-g)]\Delta\sigma$$

$$S2 = -[(L-f_{a2}+g)/(f_{a2}-g)]\Delta\sigma$$

The deviation magnifications can be defined as $\beta_1 = S1/\Delta\sigma$ and $\beta_2 = S2/\Delta\sigma$. As a result, if the deviation magnifications have opposite signs, for a deviation between the first and second objects, the lights 7 and 8 displace on the light receiving surfaces of the detecting portions 11 and 12, in opposite directions.

In the upper half of FIG. 2, the light incident on the alignment mark 5 is transformed into a convergent light which, before reaching a convergent point F1, impinges on the alignment mark 3. Then, the light is imaged on the first detecting portion 11, whereby a light image is formed. Here, the focal length $f_{b1}$ of the alignment mark 3 is determined so as to satisfy a lens equation such as follows:

$$1/(f_{a1}-g) + 1/L = -1/f_{b1}$$

Similarly, in the lower half of FIG. 2, the alignment mark 6 transforms a received light into a light divergent from a point F2, on the entrance side, which light is imaged by the alignment mark 4 upon the second detecting portion 12, whereby a light image is formed. Here, the focal length $f_{b2}$ of the alignment mark 4 is determined so as to satisfy:

$$1/(f_{a2}-g) + 1/L = -1/f_{b2}$$

Under the structural conditions described above, the imaging magnification of the alignment mark 3 to the point image by the alignment mark 5 is positive, as is clear from the drawing, and the deviation $\Delta\sigma$ of the second object 2 and the displacement S1 of the light spot on the first detecting portion 11 are in opposite directions. Thus, the deviation magnification 1 as defined hereinbefore is negative. Similarly, the imaging magnification of the alignment mark 4 to the point image (virtual image) by the alignment mark 6 is negative, and the deviation $\Delta\sigma$ of the second object 2 and the displacement S2 of the light spot on the second detecting portion 12 are in the same direction, and the deviation magnification $\beta_2$ is positive.

As a result, for a relative deviation $\Delta\sigma$ of the first and second object 1 and 2, the displacements S1 and S2 of the signal lights from a system comprising the alignment marks 5 and 3 and a system comprising the alignment marks 6 and 4, are in the opposite directions.

In other words, if in the arrangement of FIG. 2 the first object 1 is spatially fixed and the second object 2 is displaced downwardly as viewed in the drawing, the spacing of the light spots (a pair of light images) on the first and second detecting portions 11 and 12, as assumed when the first and second objects are in correct alignment with each other, is enlarged. If the second object is displaced upwardly as viewed in the drawing, the spacing is reduced.

Next, referring to FIGS. 3, 4A and 4B showing a peripheral portion of the device of the present invention, as applied to a proximity type semiconductor device manufacturing X-ray exposure apparatus, an explanation will be provided of its constitutional elements.

Denoted in these drawings at 13 is a light source such a semiconductor laser; denoted at 14 is a collimator lens (or a beam diameter changing lens); denoted at 15 is a projected light deflecting mirror; denoted at 16 is a pickup, casing (optical head); denoted at 17 is a wafer stage; denoted at 23 is a signal processing means; denoted at 19 is a wafer stage drive control; and denoted at E is the width of exposure light (X-rays), supplied from an illumination system 400. The light source 13 and the collimator lens 14 constitute a portion of light projecting means.

Denoted at 1 is a first object such as a mask, for example, having a circuit pattern to be illuminated with the exposure light. Denoted at 2 is a second object such as a wafer which is to be aligned with the mask 1 and which is to be exposed to the circuit pattern of the mask 1, with the exposure light. Alignment marks 5, 6, 3 and 4 each comprises a grating lens or mirror, comprising a one-dimensional or two-dimensional Fresnel zone plate, for example, having a one-dimensional or two-dimensional optical power. Each of these alignment marks is formed on a scribe line 10 or 9 on the mask 1 surface or the wafer 2 surface. Reference numeral 7 denotes a first light (first signal light), and reference numeral 8 denotes a second light (second signal light). Each of these lights (signal lights) 7 and 8 is the component of the light 315, emitted by the light source 13, as having been collimated by the lens 14 into a predetermined beam diameter, having been deflected by the mirror 15 and having been influenced by the alignment marks 5 and 3 (6 and 4).

In the present embodiment, a semiconductor laser is used as a light source. However, a light source with emits coherent light, such as a He—Ne laser or an Ar laser, for example, or a light source which emits incoherent light, such as a light emitting diode, for example, may be used.

In the present embodiment, the first and second detecting portions 11 and 12 are defined on one and the same sensor (photoelectric converting element) 22, to receive the lights 7 and 8. As an example, it may comprise a one-dimensional (linear) CCD.

The projected lights 315 each is obliquely incident at a predetermined angle upon the alignment mark 5 (6) on the mask 1 surface and is transmissibly diffracted thereby. Then, the light is reflectively diffracted by the alignment mark 3 (4) on the wafer 2 surface, and it is collected by the light receiving lens 21 and is incident on the light receiving surface of the sensor 22. In FIG. 4A, the illustration of the light receiving lens 21 is omitted. An output signal from the sensor 22 is received by the signal processing means 23, wherein the gravity center positions on the sensor 22 surface of the alignment lights (signal lights) 7 and 8 incident on the sensor 22 surface, are detected. By using the output signals from the sensor 22, the signal processing means 23 determines the positional deviation between the mask 1 and the wafer 2.

Here, the term "center of gravity of light" means such a point that, when in the cross-section of the light a position vector of each point in that section is multiplied by the light intensity of that point and the thus obtained products are integrated over the entire section, the integrated level has a "zero vector". As an alternative, the position of a peak point in the light intensity may be used.

Next, numerical examples of this embodiment will be explained.

The alignment marks 3-6 comprise Fresnel zone plates (or grating lenses) having different focal lengths. Each mark has a practical size of 50-300 microns in the lengthwise direction of the scribe line 9 or 10 and of 20-100 microns in the widthwise direction (Y direction) of the scribe line.

In this embodiment, each projected light 315 is incident on the mask 1 at an angle of incidence of about 17.5 degrees, with the projection component to the mask 1 surface being perpendicular to the lengthwise direction (X direction) of the scribe line.

Each projected light 315 incident on the mask 1 at a predetermined angle, is influenced by the lens function of the alignment mark 5 or 6 and is transformed into a convergent or divergent light, which emanates from the mask 1 with its chief ray defining a predetermined angle with respect to a normal to the mask 1.

The light 7 transmissively diffracted by the alignment mark 5 has a convergent point (virtual image), at a predetermined position vertically below the wafer 2 surface, while the light 8 transmissively diffracted by the alignment mark 6 has a divergent origin (virtual image) at a predetermined position vertically above the wafer 2 surface. The focal lengths of the alignment marks 5 and 6, in this case, are 214.723 microns and 156.57 microns, respectively. The spacing between the mask 1 and the wafer 2 is 30 microns. The first signal light 7 is transmissively diffracted by the alignment mark 5 and is influenced by a concave lens function of the alignment mark 3 on the wafer 2 surface, and it is converged at a point on the sensor 22 surface. Here, the displacement of the position of incidence of the light upon the sensor 22 surface corresponds to the positional deviation between the alignment marks 5 and 3 in the X direction, that is, the quantity of misalignment of them, and the light is incident with the quantity being magnified. As a result, the displacement of the gravity center position of the incident light is detected by the sensor 22.

On the other hand, the second signal light 8 is transmissively diffracted by the alignment mark 6 and, then, it is so reflectively diffracted by the alignment mark 4 on the wafer 2 surface that the spot position at the imaging point shifts in the opposite direction as the first signal light, and finally it is converted at a point on the sensor 22 surface. Like the case of the light 7, the displacement of the position of incident of the light 8 corresponds to the quantity of misalignment, as magnified. The direction of diffraction for the light 7 or 8 may preferably within a range of 7-13 deg. on the input light (315) side.

If the light receiving surface of the sensor 22 on which the lights 7 and 8 are converged, is disposed at a distance 18.657 mm from the wafer surface or at a position equivalent to it with the intervention of the light receiving lens 21, then the deviation magnifications each being defined as "(change in the spacing between the spots on the sensor)/(mask-to-wafer deviation)", are "100×" in absolute value and are opposite in direction. When these magnifications are combined, a magnification of "200×" is obtained. Thus, the relative deviation of the mask 1 and the wafer 2 of 0.005 micron in the X direction, causes a change of 1 micron in the spacing between the gravity center positions of the two lights, namely, in the spacing of the light spots. By detecting the light spot spacing, the relative positional deviation of the mask 1 and the wafer 2 can be detected. Here, as regards the spot diameter on the sensor 22 surface, if the effective diameter of the alignment mark as a lens is about 200 microns and a semiconductor laser in a range of 0.8 micron is used as a light source, then a spot diameter of approximately 200 microns can be set. The gravity center position of such a light spot can be discriminated easily, by using ordinary signal processing technique. The spacing of the two light spots at the correct alignment of the mask and the wafer, may properly be set at an order of 2 mm, for example.

Next, a description will be provided of the manner of detecting the relative position of the light projecting means (pickup head) 16 and the first object (mask) 1, which is an important feature of the present invention.

Figure 5:
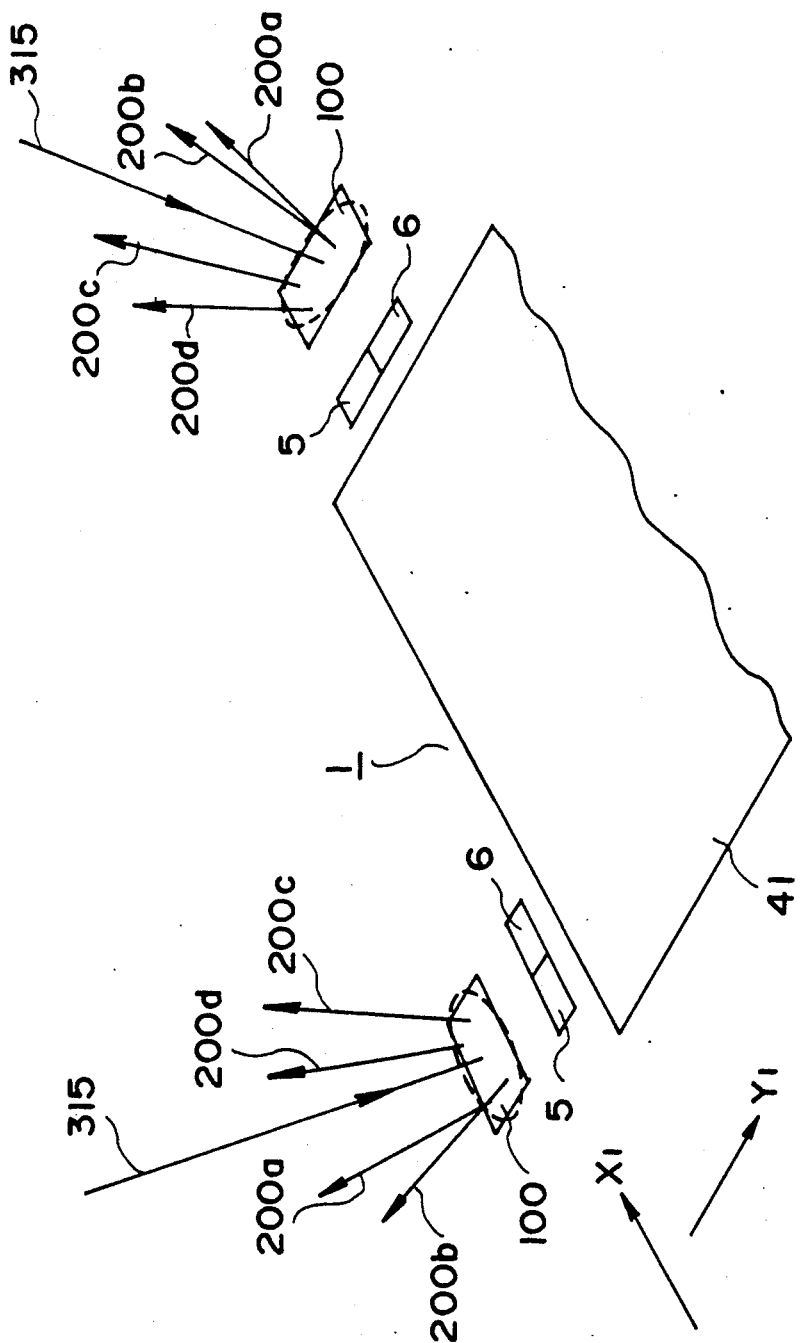
FIGS. 5, 6 and 7 are schematic representations, respectively, for explaining a part of the present invention.

FIG. 5 is a representation, for explaining reflective diffraction light produced as a result of impingement of the light 315, from the light projecting means (optical head) 16, upon a reference mark 100 which is provided in the neighborhood of the alignment mark 5 or 6 on the first object (mask) 1.

In the present embodiment, at each of four locations around a circuit pattern region 41, the alignment marks 5 and 6 are provided. In the neighborhood of these alignment marks, a reference mark 100 is provided. Thus, total four reference marks 100 are provided. Also, four pickup heads are disposed in association with the four locations (see FIG. 4A). Each light projecting means (pickup head) 16 is made movable, so as to project the light 315 onto a corresponding reference mark 100. The light 315 projected onto the reference mark 100 is reflectively diffracted. Reference numerals 200a, 200b, 200c and 200d denote diffraction lights of a predetermined order or orders (e.g. positive and negative first orders), being reflectively diffracted in predetermined directions.

Each reference mark 100 is provided at such a position that it is not transferred to the wafer 2 surface during the exposure operation.

Figure 6:
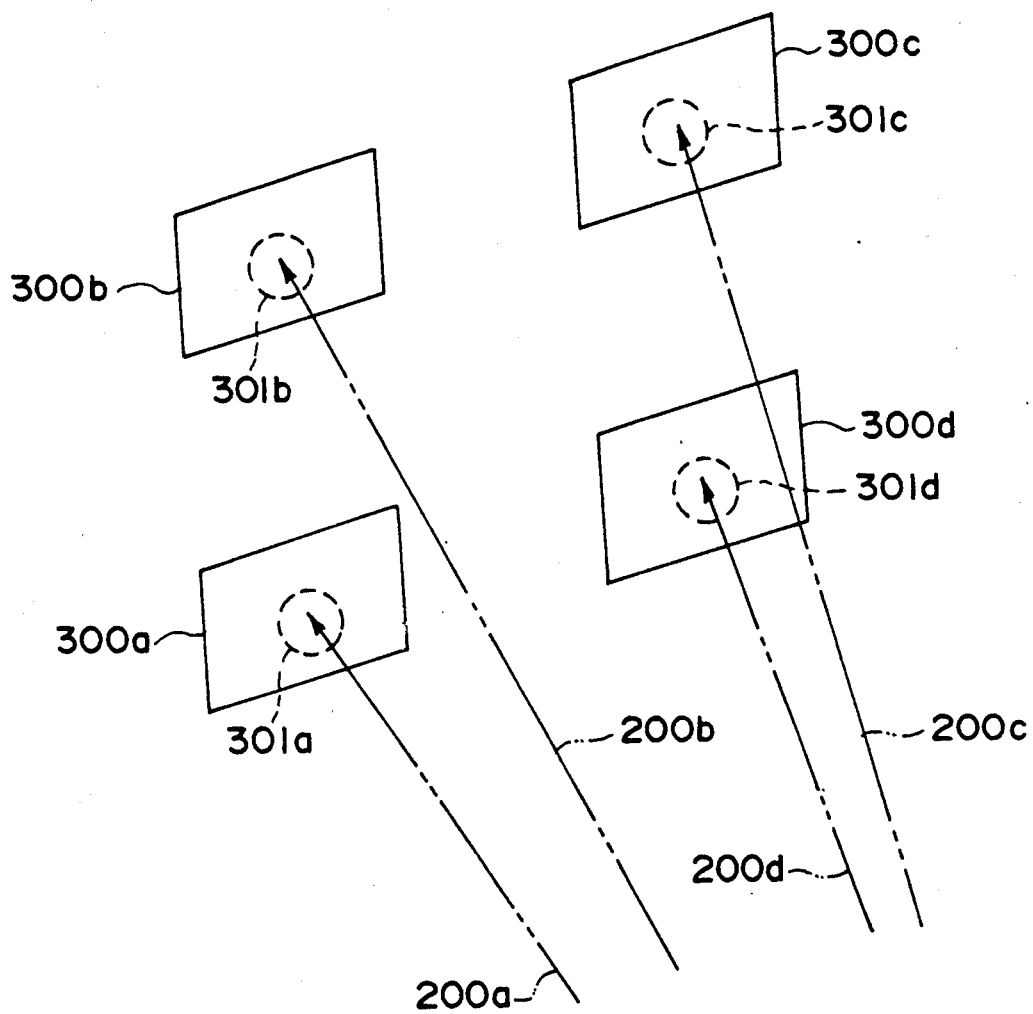

FIG. 6 illustrates light receiving means, provided in the pickup head 16, for receiving the diffraction lights 200a-200d, reflectively diffracted from the reference mark 100 shown in FIG. 5.

In the drawing, reference numerals 300a-300d denote photoelectric converting elements (photodiodes), serving as a light receiving means, for receiving the diffraction lights 200a-200d and for producing electric signals proportional to the intensities of the received lights, respectively. The regions 301a-301d depicted by broken lines, each denotes a spot of received light (diffraction light).

Figure 1:
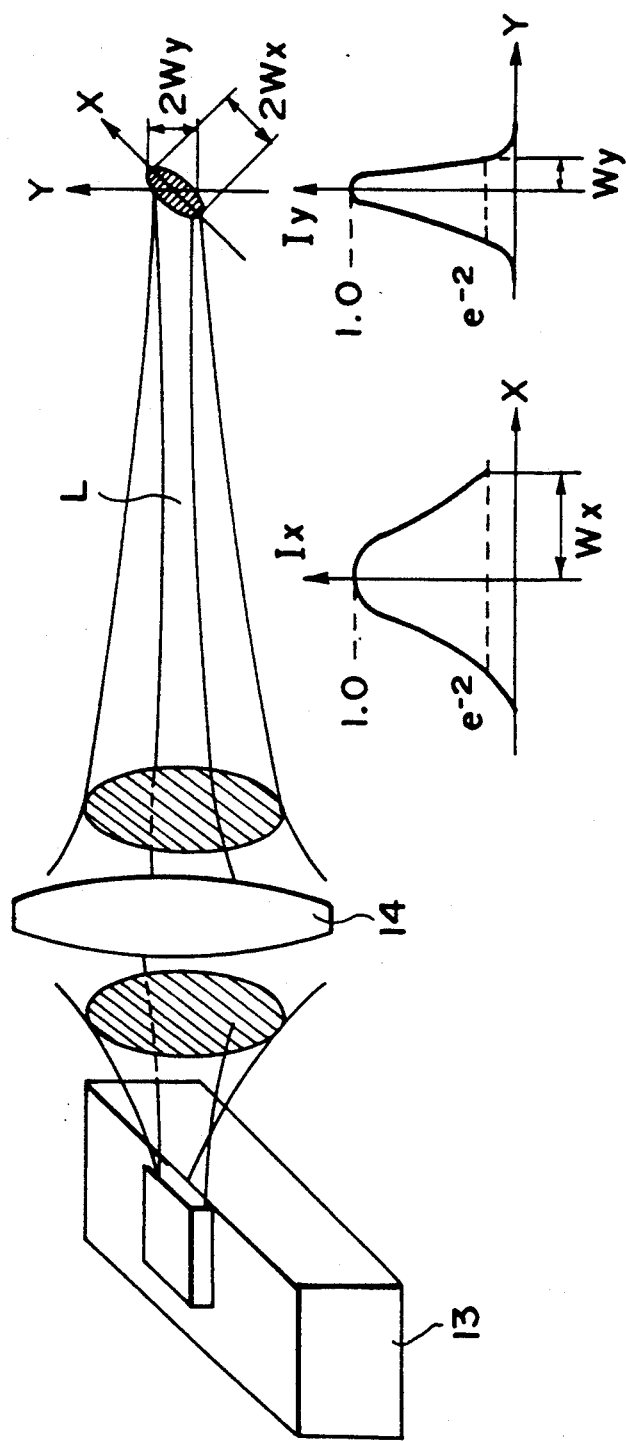
FIG. 1 is a schematic representation, for explaining the sectional intensity distribution of light as emitted by a laser.
Figure 7:
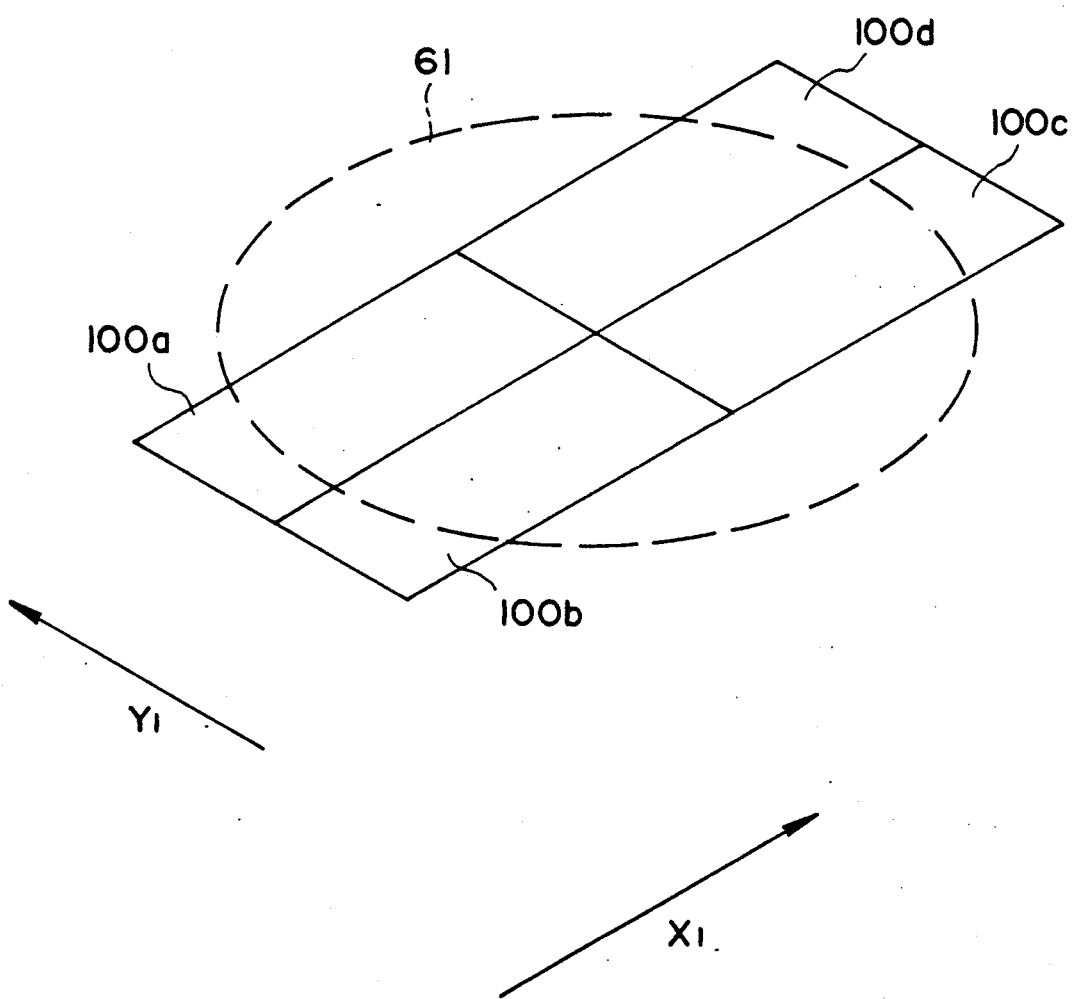

FIG. 7 illustrates the frame shape of a reference mark 100, shown in FIG. 5. The region 61 depicted by a broken line denotes the spot diameter of the projected light 315, of an intensity $e^{-2}$, for example, and it has a Gaussian intensity distribution having symmetrical axes in the $X_1$ direction and the $Y_1$ direction (see FIG. 1).

As illustrated, the reference mark 100 is provided by four marks 100a–100d which are divided symmetrically with respect to a longitudinal direction and a transverse direction. Each of the marks 100a–100d is formed with a pattern which comprises a straight grating of regular pitch, for example. The grating lines of these straight gratings are so arrayed that the projected light 315 is reflectively diffracted in different directions, toward the sensors 300a–300d.

Figure 8A:
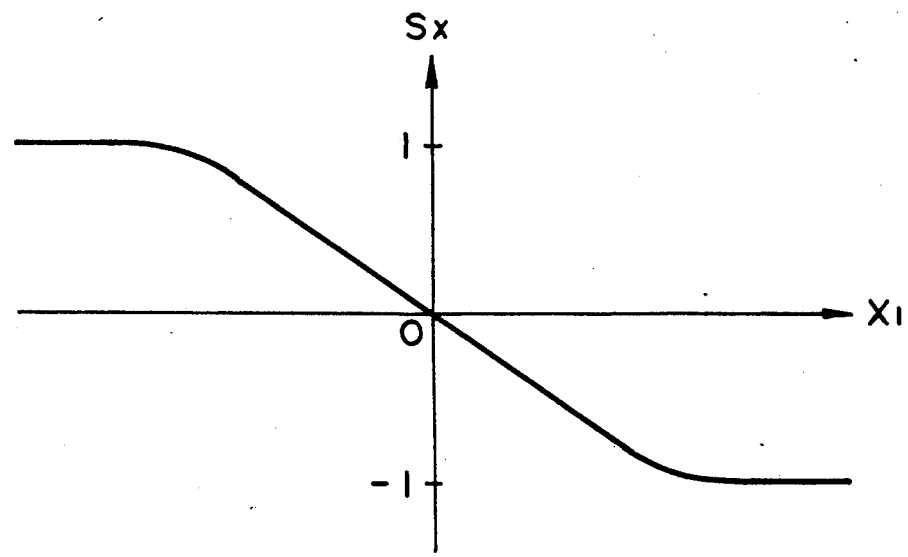
FIGS. 8A and 8B are graphs, respectively, for explaining an output signal from a sensor, in the present invention.
Figure 8B:
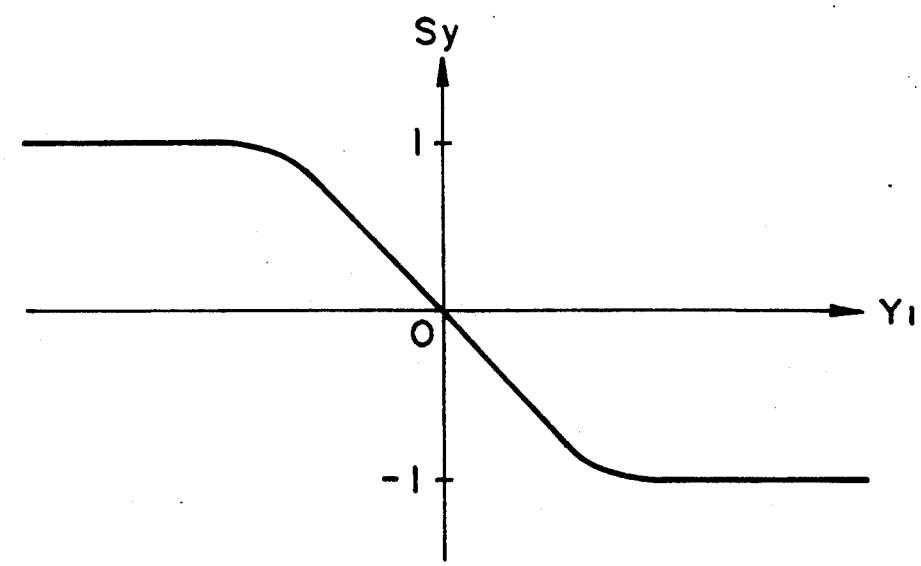

Here, the intensity of each of the reflective diffraction lights 200a–200d is proportional to that of the projected light 315 upon corresponding one of the marks 100a–100d (here, the direction of diffraction is unchanged). Therefore, if the output of the sensors 300a–300d are denoted by A, B, C and D, then, by calculating quantities Sx and Sy in accordance with the following equations:

$$Sx = [(A+B)-(C+D)]/[A+B+C+D]$$

$$Sy = [(A+D)-(B+C)]/[A+B+C+D].$$

it is possible to determine a quantity corresponding to the positional deviation between the projected light 315 and the reference mark 100. This is illustrated in FIGS. 8A and 8B. More specifically, the pickup head 16 is moved from a certain position, along the mask 1, so as to change the relative position of the pickup head 16 and the reference mark 100, and the displacement of the pickup head 16 at this time is measured by an appropriate measuring device to detect the displaced position of the pickup head 16. At the same time, the above-described quantity Sx or Sy is measured. The position of the pickup head 16 can be calibrated, while taking into account the effect of any variation in the beam diameter of the projected light 315, for example. Namely, where the characteristic curve is detected beforehand, by detecting the above-described quantities Sx and Sy as well as the position of the pickup head 16 in operation of the device, it is possible to calculate the relative positional deviation between the light projecting means (pickup head 16) and the first object (mask 1), that is, the positional deviation between the pickup head 16 and the mark 5 (6).

Next, a description will be provided of the sequence of detecting the relative positional deviation between the light projecting means (pickup head 16) and the first object (mask) 1, in this embodiment.

Generally, in a semiconductor device manufacturing exposure apparatus, a mask 1 having a circuit pattern to be lithographically transferred and alignment marks for the detection of mask-to-wafer positional deviation, is set in a manner such as shown in FIG. 4A. In accordance with the present embodiment, the pickup casing (head) 16 accommodating the light projecting means for the execution of the alignment operation is moved so as to irradiate the reference mark 100 with the projected light 315. Then, the above-described quantities Sx and Sy determine the relative positional deviation of the pickup head with respect to the reference mark 100 by calculation. On the basis of the calculation, the pickup casing 16 is displaced directly to the alignment mark 5 (6). Also, as required, re-driving may be effected for the discrimination of Sx and Sy, and the relative positioning of the projected light 315 and the reference mark 100 may be effected. Since the relative position of the reference mark 100 and the alignment mark 5 (6) is fixed and known in the preparation of the mask pattern, it is possible to move the pickup head 16 along the mask 1 surface on the basis of the known value. In this manner, the pickup casing (head) 16 can be initially set with respect to the mask 1 and, as a result, high-precision alignment of the first and second objects (mask and wafer) is attainable by using the pickup head 16.

Figure 9A:
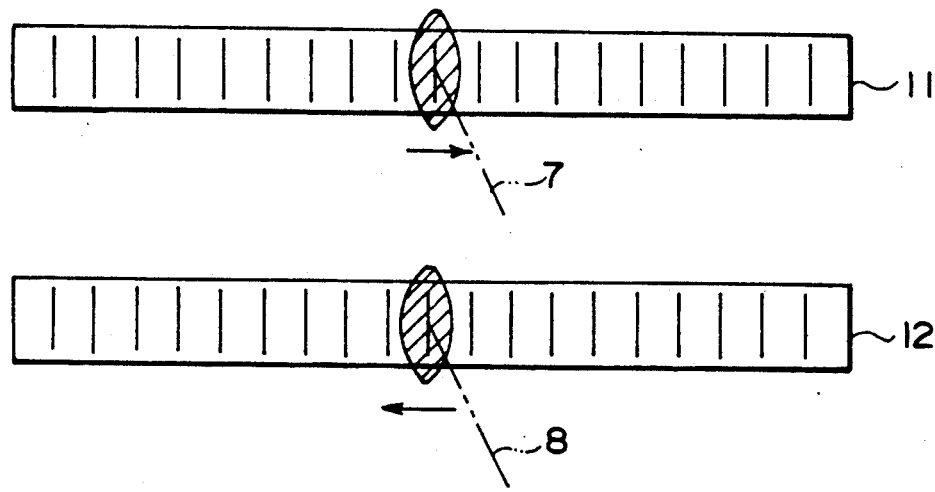
FIGS. 9A and 9B are schematic representations, respectively, each for explaining a detecting portion according to the present invention.

As for the sensors 300a–300d, the first and second detecting portions 11 and 12 for detection of the relative positional deviation of the mask 1 and the wafer 2, may be used. More specifically, such as shown in FIGS. 9A and 9B, the first and second detecting portions 11 and 12 may be provided by a pair of linear line sensors and, for the calculation of the relative positional deviation of the mask 1 and the wafer 2, the positional information about the signal lights (lights 7 and 8) on the first and second detecting portions 11 and 12, such as shown in FIG. 9A, may be produced by calculation and the relative positional deviation may be determined in accordance with the principle described hereinbefore.

Figure 9B:
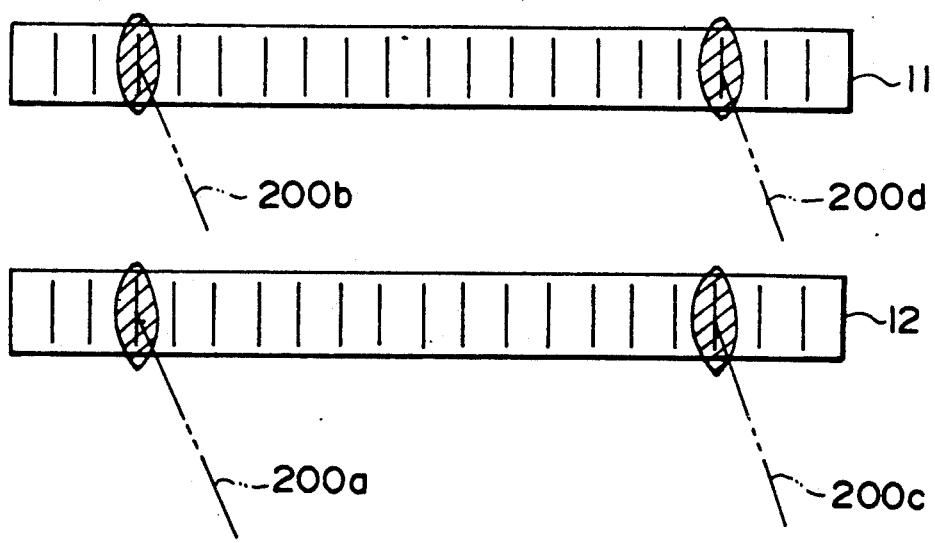

On the other hand, the diffraction angles of the reflective diffraction lights 200a–200d from the reference mark 100 as irradiated with the projected light 315, may be so set that, as shown in FIG. 9B, the reflective diffraction lights impinge on the first and second detecting portions 11 and 12 and also that, on the detection surface, they can be separated from each other. By doing so and if an appropriate processing area is defined to the output signals from the detecting portions 11 and 12 (namely, an appropriate bit number of the line sensor including the peaks of the signal lights and effective to reduce the cross-talk of the diffraction lights is determined) and the integrated signal intensity on that area is detected, then the system can substitute for the sensors 300a–300d. If this is done, it is not necessary to provide two separate light receiving portions and, therefore, the structure of the pickup casing (head) 16 can be simplified.

Figure 10:
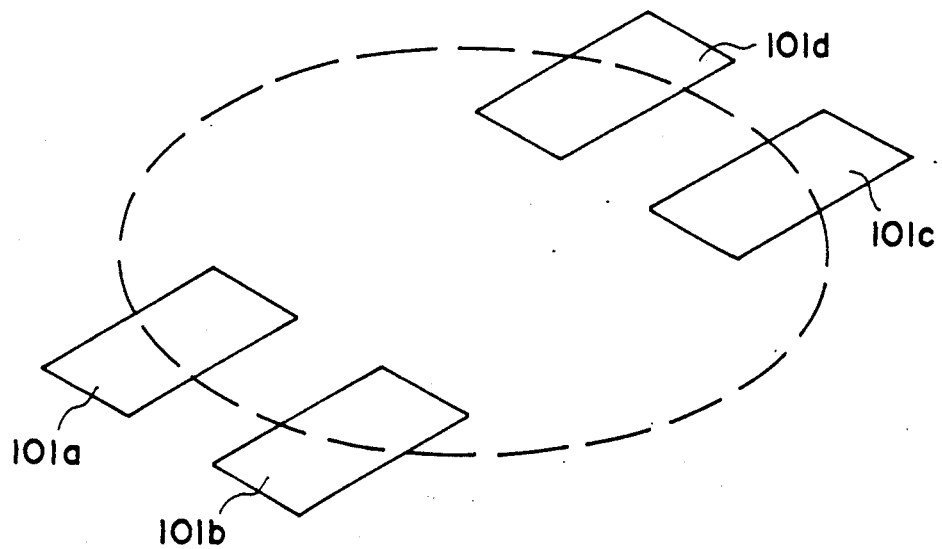
FIGS. 10 and 11 are schematic representations, respectively, each for explaining a sensor according to another embodiment of the present invention.

Further, the reference mark 100 is not limited to the frame-like shape shown in FIG. 7, and frame structures (101a–101d) such as shown in FIG. 10, with the central pattern portion being omitted, may be used. In this case, the ratio of the light quantity impinging on the sensor surface to the unit light quantity as projected, decreases. However, the sensitivity of the sensor to a relative deviation between the projected light 315 and the marks (101a–101d) of the reference mark 100 can be enhanced and, thus, the resolution can be improved. Therefore, this arrangement is particularly effective in the cases where the light projection optical system can provide a sufficient light quantity.

Figure 11:
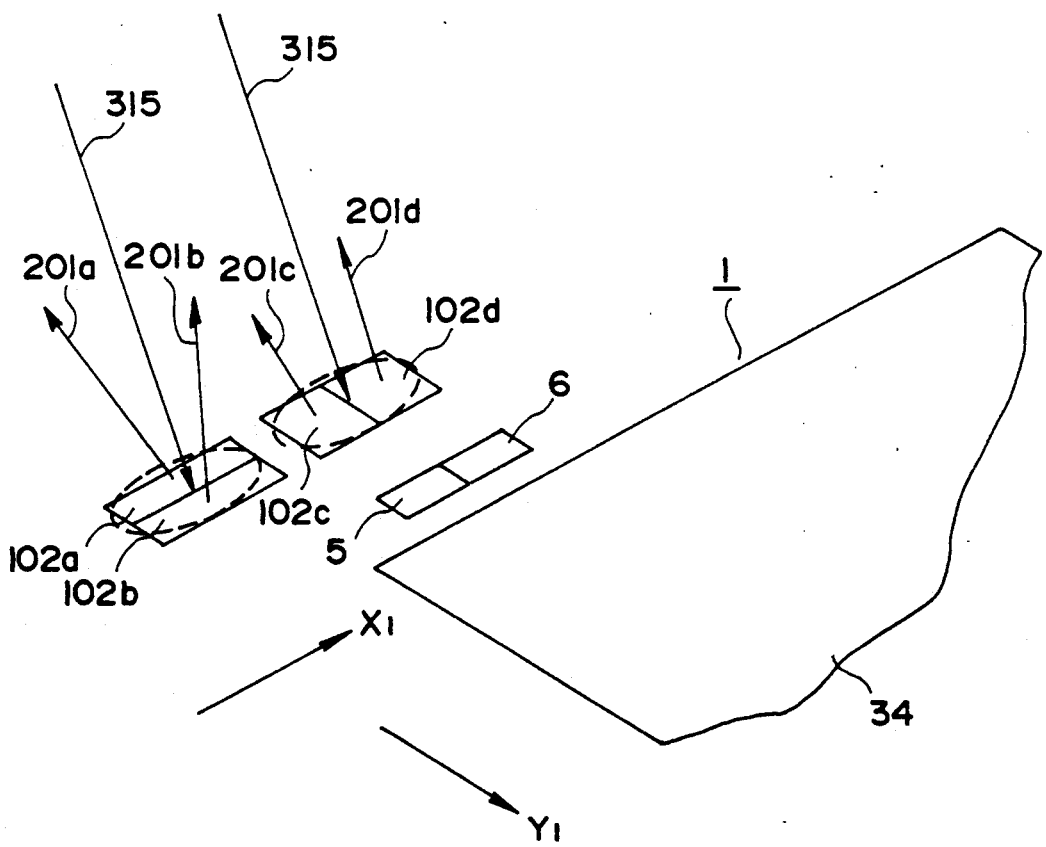

In the present embodiment, the detection of the positional deviation between the mask 1 and the projected light 315 is effected two-dimensionally, namely, with respect to the X and Y directions at the same time. However, the detection may be made in the time-sharing manner in these directions. FIG. 11 shows this example, wherein the reference mark 100 is divided into a set of marks 102a and 102b and a set of marks 102c and 102d. First, light 7 is projected to the set of marks 102a and 102b, and the positional deviation in the Y direction is detected in the manner described above.

Subsequently, the light projecting means is displaced, and the positional deviation in the X direction is detected by using the set of marks 102c and 102d. After this, in the manner described hereinbefore, the alignment marks 5 and 6 are used to align the first and second objects (mask and wafer) 1 and 2 with each other. This method is effective to increase the quantity of light impinging on the sensor in the, even if the quantity of projected light is not sufficient. This method is also effect the structure of the system since, by to simplify setting the same diffraction angle to the diffraction lights 201a and 201c and by setting the same diffraction angle to the diffraction lights 201b and 201d, the use of two light receiving elements is allowed.

In the foregoing examples, the invention has been described with respect to the alignment of the mask 1 and the light projecting means (pickup head) 16, when a similar reference mark is provided on a member which is integral with a wafer stage, in place of the mask 1, substantially the same sequence can attain the relative alignment of the light projecting means (pickup head) and the wafer stage.

In accordance with these embodiments of the present invention, a reference mark is provided on the surface of a first object or a second object and, by using diffraction light from the reference mark, the positional relationship between a pickup head and the first object or the positional relationship between the pickup head and the second object, can be set correctly. Therefore, the relative position detection and the relative alignment of the first and second objects, to be made subsequently by using alignment marks of these objects, can be done with high precision.

Referring now to FIGS. 12-16, another embodiment of the present invention will be explained. In this embodiment, the invention is applied to a semiconductor device manufacturing exposure apparatus, like the preceding embodiment.

In the drawings, denoted at 1 is a mask which is placed on a mask stage (not shown). Denoted at 2 is a wafer which is placed on a movable wafer stage (not shown). The wafer 2 is to be exposed to a circuit pattern of the mask 1 with radiation, for the manufacture of semiconductor devices.

Denoted at 13 is a light source which may comprise a coherent light source such as a semiconductor laser, a He—Ne laser, an Ar laser or the like; an incoherent light source such as a light emitting diode or the like; or an X-ray source. Denoted at 302 is a collimator lens for transforming the light from the light source 13 into parallel light which enters a lens system 305. The lens system 305 serves to shape the received light into a desired beam diameter and directs the same to a mirror 306. The light is reflected by the mirror 306 and goes through an X-ray window 307 (where an X-ray source is used as a light source), and the light is incident on a positional deviation detecting autoalignment mark (hereinafter "AA mark") 20M provided on the first object (mask) 1 as well as a surface spacing detecting autofocusing mark (hereinafter "AF mark") 21M. The light source 13, the collimator lens 302, the lens system 305 and the mirror 306 cooperate to provide a light projecting means. Denoted at 100 is a reference mark which is provided for the detection of the relative positional relation between a pickup head 16, to which the light projecting means is fixed, and the first object (mask) 1, to be described later.

At each of four locations on scribe lines at the peripheral portion of the mask 1, the AA mark 20M, the AF mark 21M and the reference mark 100 are provided. Denoted at 2 is a second object (wafer) which is disposed in proximity to the mask 1, with a gap or spacing of 10-100 microns. The wafer has autoalignment marks (hereinafter "AA marks") 20W to be aligned with the AA marks 20M of the mask 1, and these marks are formed on scribe lines. The AA marks 20M and 20W and the AF marks 21M, each comprises a physical optic element such as, for example, a one-dimensional or two-dimensional zone plate, having a one-dimensional or two-dimensional power. Each reference mark 100 comprises a straight diffracting grating or a curved diffraction grating.

Denoted at 310 is a light receiving lens for receiving diffraction light 316 of a predetermined order or orders, from the AA mark 20M and the AF mark 21M on the mask 1 surface, and for collecting it upon the surface of a photodetector 311, which is a constituent element of light receiving means (310, 311). The light receiving element 311 comprises two line sensors (an autoalignment sensor 312 for the positional deviation detection and an autofocusing line sensor 313 for the surface spacing detection) which are provided on the same substrate.

In the present embodiment, one of the AA line sensor 12 and the AF line sensor 13 serves to detect diffraction light from the reference mark 100.

Alignment head (pickup head) 16 is adapted to be moved along the mask 1 surface by a driving means (not shown).

FIG. 13 is an exemplary representation of AA marks 20M and 20W and an AF mark 21M, provided on the mask 1 and the wafer 2.

FIG. 14 illustrates the paths of light influenced or to be influenced by the marks of the mask 1 and the wafer 2. The AA mark 20M comprises two AA marks 20M1 and 20M2, and the AA mark 20W comprises two AA marks 20W1 and 20W2. The AF mark 21M comprises two entrance side AF marks 21M1 and 21M3 as well as two exit side AF marks 21M2 and 21M4.

The wafer 2 has no AF mark, and a zero-th order reflection (regular reflection) light by the wafer surface is used.

The AA marks 20M1 and 20W1 are used in a pair, while the AA marks 20M2 and 20W2 are used in another pair. Two lights 315 are projected to the AA marks 20M1 and 20M2, respectively, and by these marks two diffraction lights (hereinafter "AA diffraction lights") 26-1 and 26-2 are produced. These AA diffraction lights are displaceable along the AA line sensor 12 surface in accordance with a positional deviation between the mask and the wafer.

Also, the lights 315 are incident on the AF marks 21M1 and 21M3. Then, they are reflected by the wafer surface to the AF marks 21M2 and 21M4, respectively, whereby two diffraction lights (hereinafter "AF diffraction lights") 27-1 and 27-2 are emitted from these marks. The AF diffraction lights are displaceable along the AF line sensor 13 surface in accordance with the spacing between the mask surface and the wafer surface.

In FIG. 14, the input lights 315 are provided by the light rays of a single light beam emanating from the light source 13.

The position detecting device of this embodiment is arranged so that, after the relative position of the light projecting means (optical head 16) and the mask 1 is detected and the positional relationship of them is adjusted by a driving means (for moving the head 16), the mask-to-wafer alignment operation is made. Now, the principle of positional deviation detection as well as the principle of surface spacing detection, in the present embodiment, will be explained.

First, referring to FIG. 15, the method of detecting the relative position of the mask 1 and the wafer 2 in a plane parallel to them, will be explained.

Figure 15:
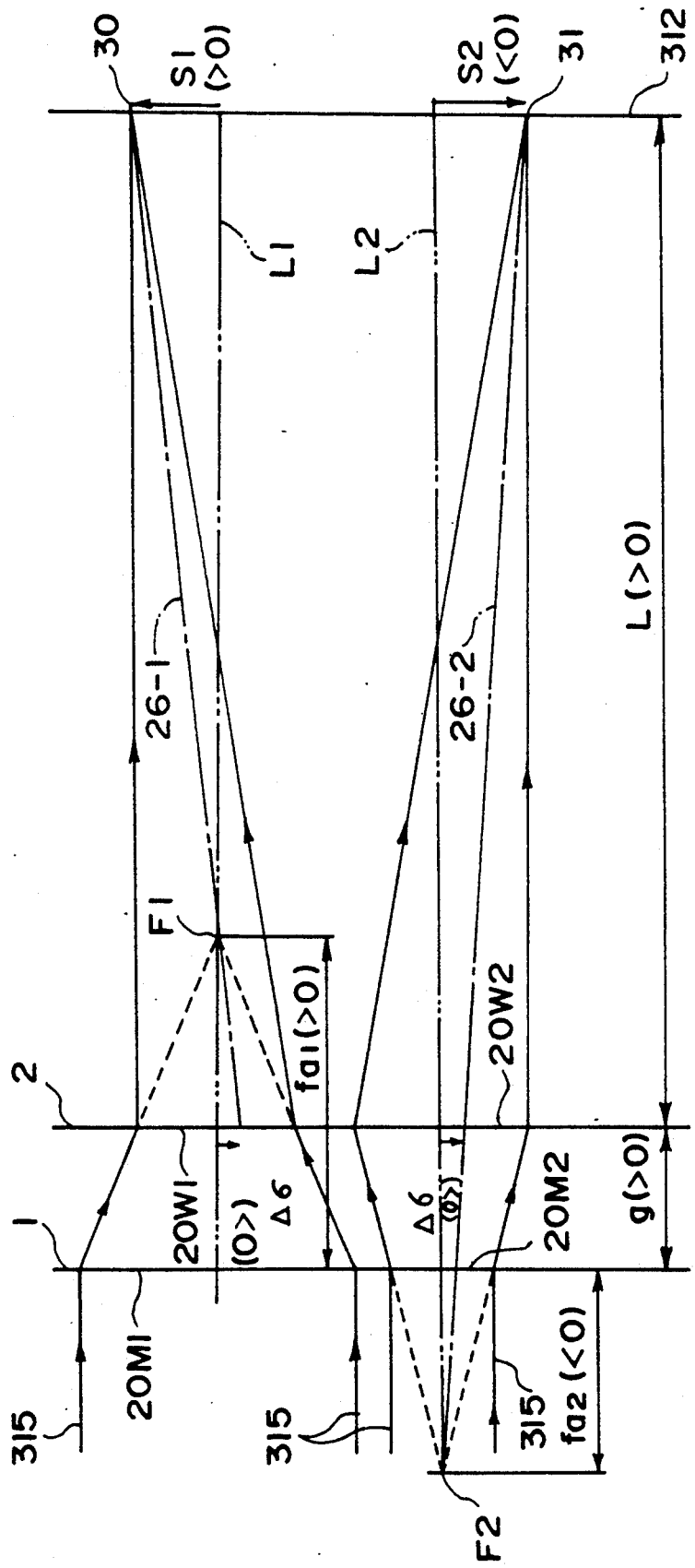
FIGS. 15 and 16 are schematic representations, respectively, for explaining the principle of positional deviation detection and the principle of surface spacing detecting in the embodiment of FIG. 12.

FIG. 15 illustrates, in an extended view, the light paths as seen from a direction which is perpendicular to the position detecting direction (alignment direction) in FIG. 14 and also perpendicular to a normal to the mask 1 surface or the wafer 2 surface.

Figure 12:
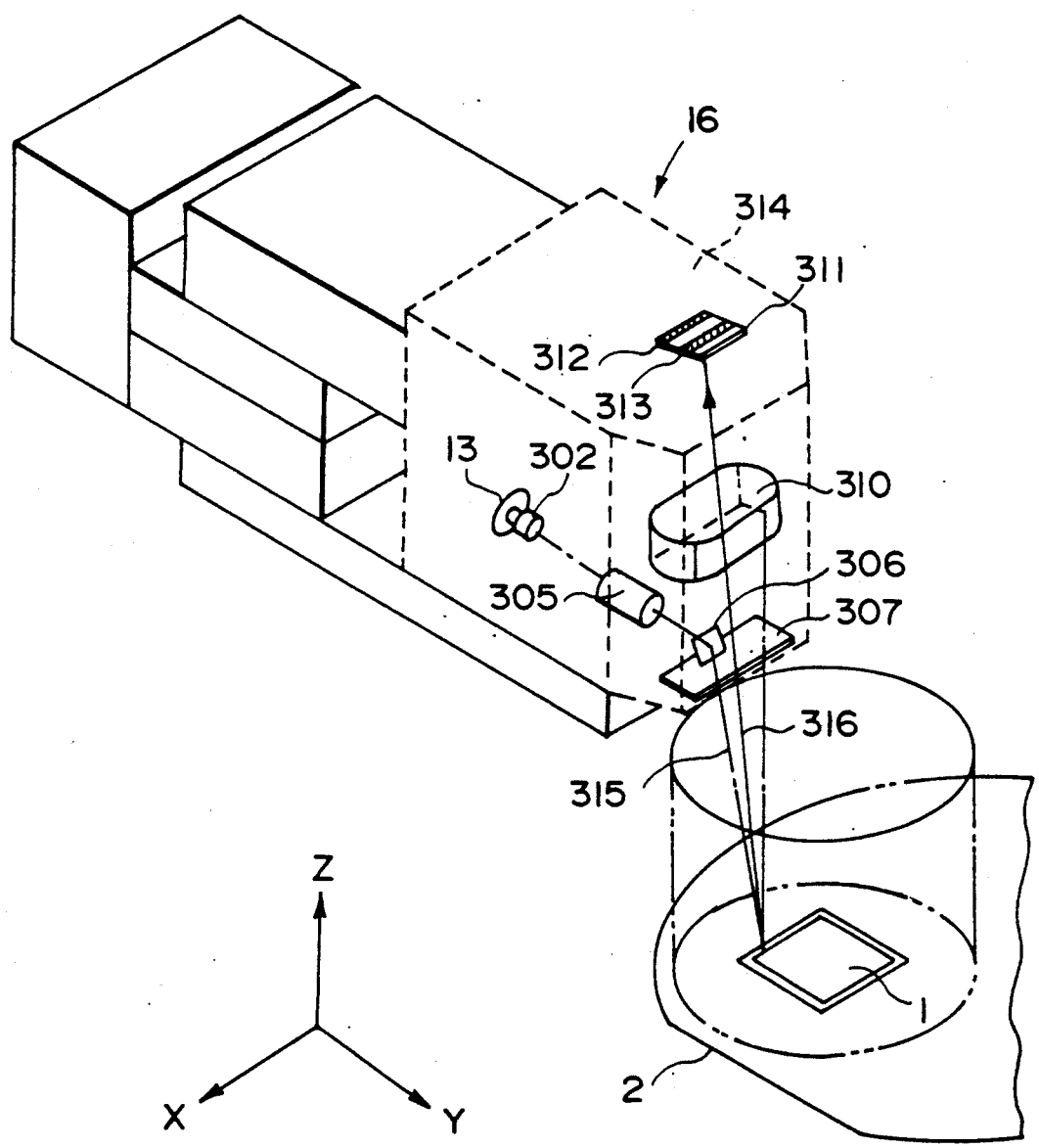
FIG. 12 is a perspective view, schematically showing a major part of another embodiment of the present invention.

In FIG. 15, like numerals as of those of FIGS. 12-14 are assigned to corresponding elements. Also, while the AA mark of the wafer 2 serves to reflectively diffract an input light, in the drawing it is illustrated as an equivalent reflective diffraction mark.

The mark 20M1 is an AA mark provided on the mask 1 while the mark 20W1 is an AA mark provided on the wafer 2, each constituting a single mark for obtaining a first signal (signal light). The mark 20M2 is an AA mark provided on the mask 18 while the mark 20W2 is an AA mark provided on the wafer 19, each constituting a single mark for obtaining a second signal (signal light). Denoted at 26-1 and 26-2 are AA diffraction lights, representing the first and second signal lights. Denoted at 312 is a primary focal plane which is optically conjugate with the light receiving element 311 with respect to the light receiving lens 310.

It is now assumed that the distance from the wafer 2 to the primary focal plane 312 is L; the spacing between the mask and the wafer is g; the focal lengths of the AA marks 20M1 and 20M2 are $f_{a1}$ and $f_{a2}$; the relative positional deviation between the mask and the wafer is $\Delta\sigma$; and the displacements of the first and second signal lights (AA diffraction lights) 26-1 and 26-2, at this time, are S1 and S2, respectively.

For convenience, the light 315 incident on the mask 1 comprises a plane wave, and the sign is such as illustrated. The displacements S1 and S2 of the gravity centers of the signal lights (AA diffraction lights) 26-1 and 26-2, each can be determined geometrically as a deviation of an optical axis L1 (L2) from the intersection between the primary focal plane 32 and a straight line that connects the focal point F1 (F2) of the AA mark 20M1 (20M2) and the center of the AA mark 20W1 (20W2), corresponding to the top of a lens. Therefore, in order that, for a relative positional deviation between the mask and the wafer, the displacements S1 and S2 of the gravity centers of the signal lights (AA diffraction lights) 26-1 and 26-2 are produced in opposite directions, the optical imaging magnifications of the AA marks 20W1 and 20W2 are set with opposite signs.

Quantitatively, the displacements can be represented as follows:

$$S1 = -[(L-f_{a1}+g)/(f_{a1}-g)]\Delta\sigma$$

$$S2 = -[(L-f_{a2}+g)/(f_{a2}-g)]\Delta\sigma$$

The deviation magnifications can be defined as $\beta_1 = S1/\Delta\sigma$ and $\beta_2 = S2/\Delta\sigma$. Therefore, for providing deviation magnifications of opposite signs, the following relation can be satisfied:

$$[(L-f_{a1}+g)(f_{a2}-g)]/[(L-f_{a2}+g)(f_{a1}-g)] < 0$$

In regard to this relation, there is one practically suitable structural condition such as follows:

$$L >> |f_{a1}|$$

$$f_{a1}/f_{a2} < 0$$

$$|f_{a1}| > g$$

$$|f_{a2}| > g$$

Namely, it is a structure wherein, to the focal lengths $f_{a1}$ and $f_{a2}$ of the AA marks 20M1 and 20M2, the distance L to the primary focal plane 32 is made large, while the spacing g between the mask and the wafer is made small and, additionally, one of the AA marks is provided by a convex lens while the other is provided by a concave lens.

In the upper half of FIG. 15, the AA mark 20M1 transforms received light into convergent light which, before reaching its focal point F1, impinges upon the AA mark 20W1. The light is then imaged upon the primary focal plane 32. The focal lengths $f_{b1}$ of the AA mark 20W1 is determined so as to satisfy the following lens equation:

$$1/(f_{a1}-g) + 1/L = -1/f_{b1}$$

Similarly, in the lower half of FIG. 15, the AA mark 20M2 transforms a received light into a divergent light, diverging from a point F2 at the entrance side, and the light is imaged by the AA mark 20W2 upon the primary focal plane 32. The focal length $f_{b2}$ of the AA mark 20W2 is determined so as to satisfy the following relation:

$$1/(f_{a2}-g) + 1/L = -1/f_{b2}$$

Under the structural conditions as described above, clearly from the drawing, the imaging magnification of the AA mark 20W1 to the point image (virtual image) by the AA mark 20M1 is positive. Thus, the deviation $\Delta\sigma$ of the wafer 2 and the displacement S1 of the spot of light upon the primary focal plane 32 are in opposite directions and, thus, the deviation magnification $\beta_1$ as defined hereinbefore is negative. Similarly, the imaging magnification of the AA mark 20W2 to the point image (virtual image) by the AA mark 20M2 is negative, and the deviation $\Delta\sigma$ of the wafer 2 and the displacement S2 of the spot of light upon the primary focal plane 32 are in the same direction. Thus, the deviation magnification $\Theta_2$ is positive.

As a result, for a relative positional deviation $\Delta\sigma$ of the mask 1 and the wafer 2, the displacements S1 and S2 of the AA diffraction lights (signal lights) 26-1 and 26-2 from a system comprising the AA marks 20M1 and 20W1 and a system comprising the AA marks 20M2 and 20W2, are in opposite directions. Namely, the distance between the light spot 30 as formed on the primary focal plane 32 by the diffraction through the grating patterns of the AA marks 20M1 and 20W1 and the light spot 31 as formed on the primary focal plane 32 by the diffraction through the grating patterns of the AA marks 20M2 and 20W2, changes with the quantity of positional deviation between the mask 1 and the wafer 2. These two light spots 30 and 31 are projected by the light receiving lens 10 upon the surface of the AA line sensor 312 of the light receiving means 11. Then, the spacing between the two light spots (light images) 30 and 31 is detected through the AA line sensor 312, whereby the relative positional deviation between the mask 1 and the wafer 2 is determined.

Figure 17:
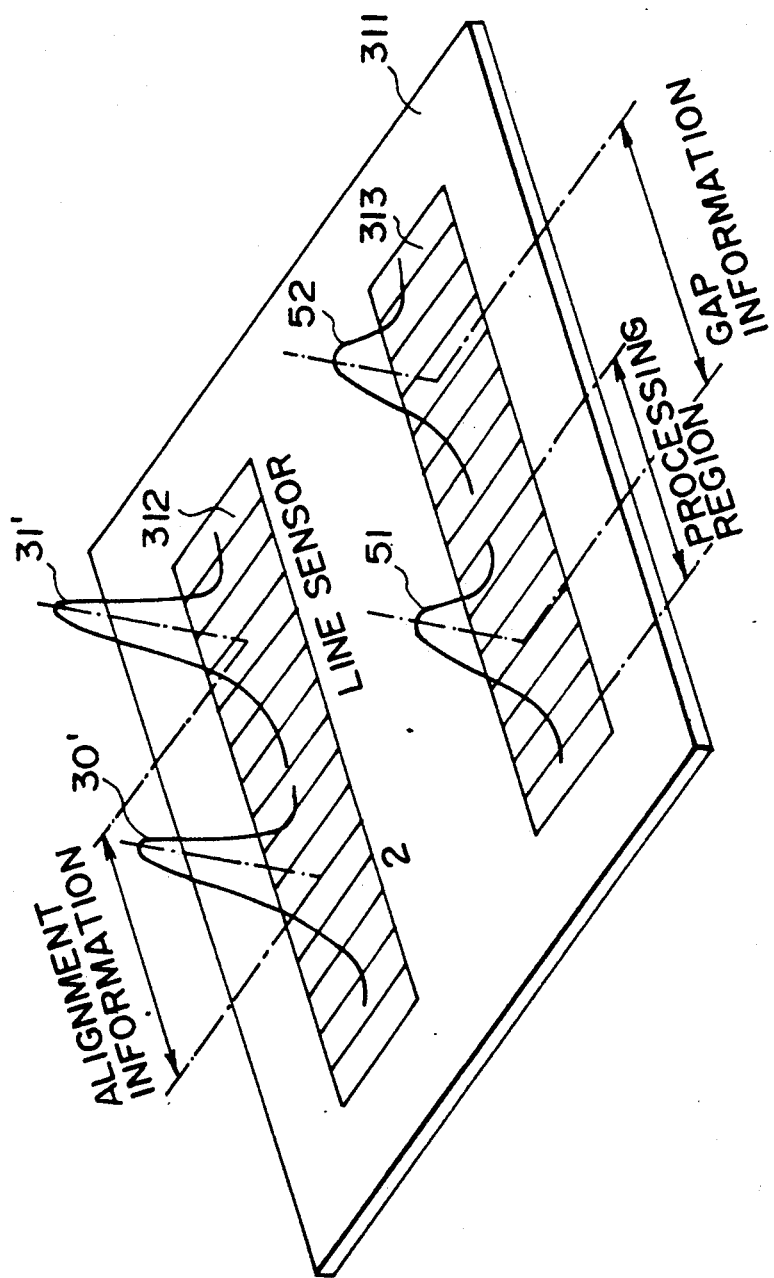
FIG. 17 is a schematic representation, for explaining a sensor of FIG. 12.

FIG. 17 is a schematic representation, showing two light spots (light images) 30' and 31', formed on the sensor 312 surface.

In the present embodiment, even if the wafer 2 is tilted relative to the mask 1, the two light spot images 30' and 31' are displaced along the primary focal plane 312, in the same direction and by the same amount. Therefore, the spacing of these light spot images is unchanged and, as a result, any inclination does not cause a detection error.

Figure 16:
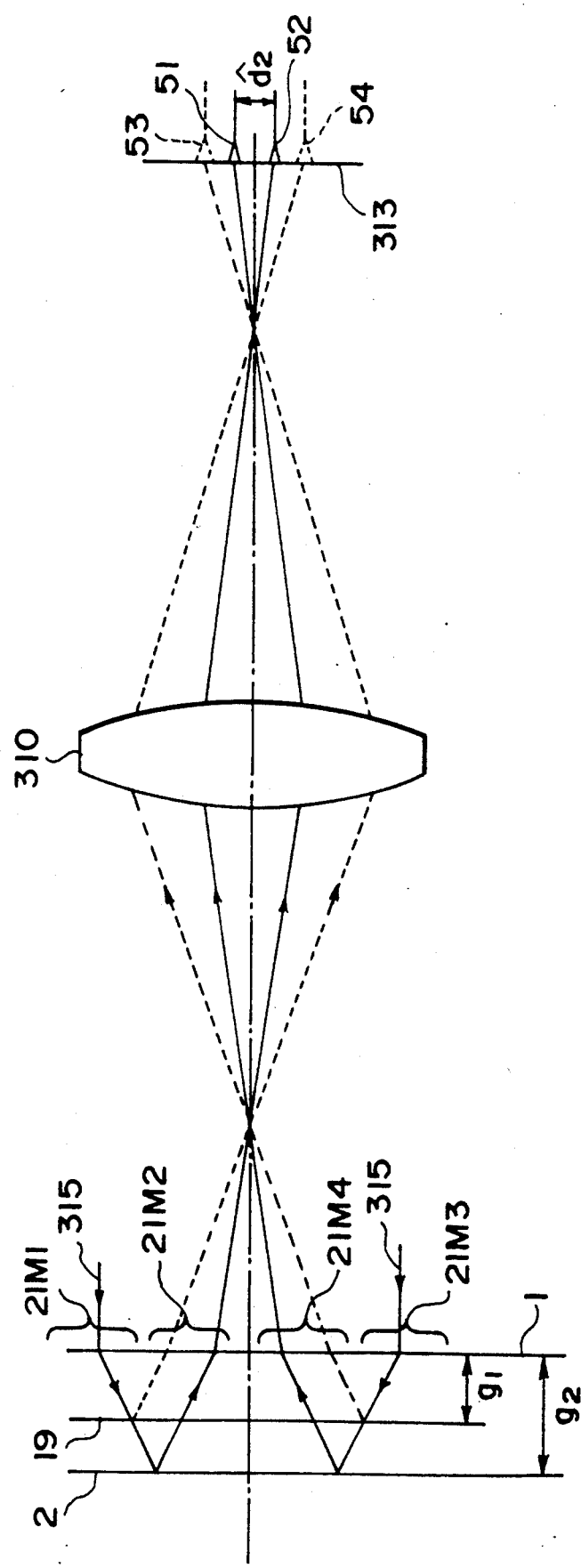

Next, the method of detecting the surface interval between the mask 1 and the wafer 2, will be explained in conjunction with FIG. 16. In the drawing, like numerals as of those of FIGS. 12-14 are assigned to corresponding elements.

In this example, input light 315 is incident on two AF marks 21M1 and 21M3 provided on the mask 1 surface. Here, the light incident on the AF mark 21M1 (21M3) is diffracted thereby and, as an example, a first order diffraction light is regularly reflected by the wafer 2 surface, which is spaced from the mask 1 by a certain gap or spacing, and then it is incident on an AF mark 21M2 (21M4) provided on the mask 1 surface. The AF mark 21M2 (21M4) comprises a zone plate pattern having a light converging function like that of a lens. Additionally, it has an optical function with which, as the light reflected by the wafer 2 is incident on the AF mark 21M2 (21M4), the angle of emission of the emanating diffraction light from the mark 21M2 (21M4) changes with the position of incidence (i.e. the pupil position of the grating area).

If, for example, the surface interval between the mask 1 and the wafer 2 is $g_2$, the AF diffraction lights (third and fourth signal lights) having been diffracted by the AF marks, advance along the paths as depicted by solid lines and go through the light receiving lens 310, whereby two light spots 51 and 51 are formed on an AF line sensor 313 surface. If, on the other hand, the surface interval is $g_1$, the AF diffraction lights (third and fourth signal lights) diffracted by the AF marks, advance along the paths as depicted by broken lines, and two light spots 53 and 54 are formed on the AF line sensor 313 surface.

FIG. 17 is a schematic representation, showing the two light spots 51 and 52 as formed on the sensor 313 surface.

In this manner, in accordance with the surface interval between the mask 1 and the wafer 2, the spacing between the two light spots as formed on the AF line sensor 313 surface changes. Thus, by measuring the spacing of the two light spots, the surface interval of the mask 1 and the wafer 2 can be detected.

Next, referring to FIGS. 18-21, the method of detecting the relative position of a light projecting means (pickup head 16) and a first object (mask) 1, which is an important feature of the present invention, will be explained.

In the present embodiment, as seen from FIG. 19A, in the neighborhood of each of the alignment marks 83 (AA marks and AF marks) provided at four locations on a scribe line 82, around a pattern region 81 to be transferred, a reference mark 100 is provided. As best seen in FIG. 19B, each reference mark 100 comprises two marks 100a and 100b, each being provided by a straight diffraction grating. Generally, as shown in FIG. 18, if light 72 is incident on a reflection type diffraction grating 71, the incident light 72 is reflectively diffracted. Here, if the grating pitch of the diffraction grating 71 is P; the wavelength of the incident light 72 is λ; the angle of incidence (the angle with respect to a normal to the diffraction grating 71) is θi; and the angle (emission angle) of n-th order reflective diffraction light with respect to the normal to the diffraction grating 71 is θn, then the following relation is given:

$$P\sin\theta i - P\sin\theta n = n\lambda (n=0, \pm 1, \pm 2, \ldots) \tag{a1}$$

From this, the emission angle θn is given by $$\theta n = \sin^{-1}(\sin\theta i - n\lambda/P) \tag{a2}$$

If, for example, λ=0.780 micron, θi=17 deg. and P=3 microns, then:

$\theta 0 = \theta i = 17$ (deg)

$\theta 1 = 1.833$ (deg) (first order diffraction light)

$\theta 2 = -13.1575$ (deg) (second order diffraction light)

The negative sign of the emission angle θ2 means that, as shown in FIG. 18, the reflective diffraction light has been diffracted at an angle of 13.1575 deg., with respect to a normal to the diffraction grating 71, into the light entrance side with respect to the normal.

Figure 24:
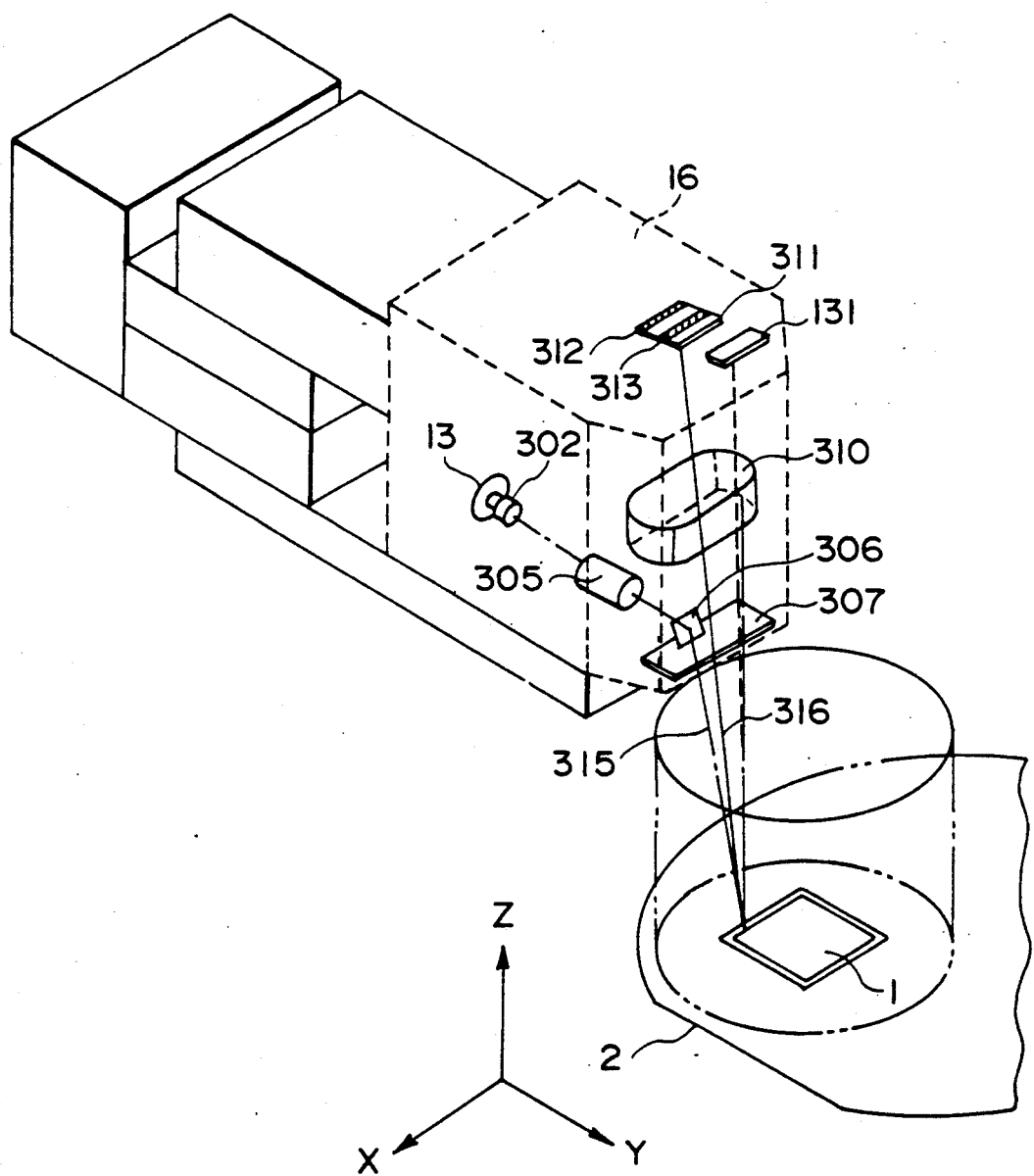
FIG. 24 is a perspective view, schematically showing a major part of another embodiment of the present invention, which corresponds to a modified form of the FIG. 12 embodiment.

The present invention uses such diffraction phenomenon of the diffraction grating. More specifically, as shown in FIG. 19B, a reference mark 100 is provided, and alignment light 315 is projected to the marks 100a and 100b of the reference mark 100, in sequence, so as to scan the marks in the directions as depicted by arrows 72a and 72b in FIG. 20. Reflective diffraction light therefrom is directed through a lens 310 (FIG. 12) to a sensor 311 or a separate sensor 131 (FIG. 24), for example, provided in the neighborhood of the sensor 311. Then, a peak of the output signal (intensity signal) from the sensor 311 or 131, as obtainable with the scan by the light 315, is detected and, on the basis of the detection, the state of alignment between the input light 315 and the mark 100a (100b) is discriminated. By this, the relative position of the light projecting means (pickup head 16) and the first object (mask) 1 can be detected.

In the present embodiment, the light projecting means (pickup head 16) is made movable through a driving means, such that, at different positions and in different directions, the light 315 can be projected to the reference mark 100.

By using the relative position of the pickup head and the mask as detected in the manner described above, the position of incidence and the direction of incidence of the light 315 from the pickup head 16, for the mask-to-wafer alignment, are adjusted.

Figure 21A:
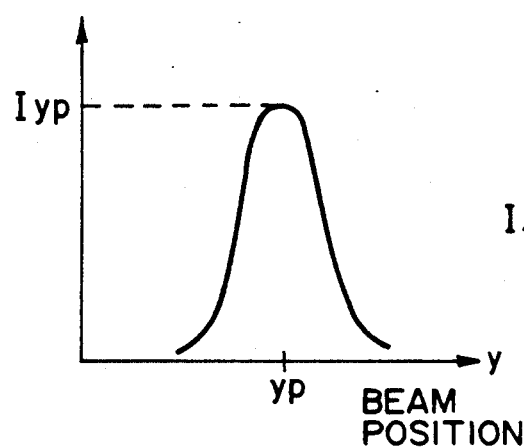
FIGS. 21A and 21B are graphs, respectively, for explaining an output signal from a sensor in FIG. 12.
Figure 21B:
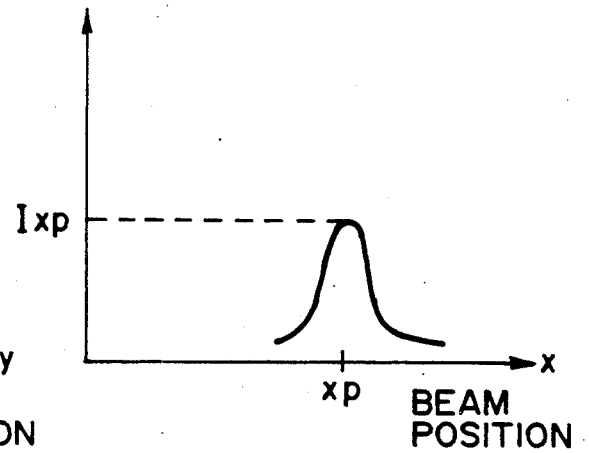

More specifically, in the present embodiment, the light 315 is usually set so as to correspond to the size of the alignment pattern 83 and, as the light 315 is displaced along the X-Y plane (mask surface), the lights diffracted by the marks 100a and 100b each comprising a diffraction grating are photoelectrically detected, in terms of a change in intensity, by the sensor 311 or 131 in respect to the X and Y directions, such as shown in FIGS. 21A and 21B.

Here, as the light 35 is incident correctly at the center of the mark 100a or 100b, the output signal from the sensor 311 or 131 becomes a maximum.

Now, the position of the light in the X and Y directions, at which the output signal from the sensor becomes maximum, is denoted by (xp, yp). Since the relative position of the alignment pattern 83 and the reference mark 100 on the mask surface is predetermined in accordance with the mask pattern design values, on the basis of the position (xp, yp) representing the positional relationship between the alignment head and the reference mark 100, it is possible to set the position of incidence of the light 315 from the light source 13, namely, the position of the alignment head 16, very precisely.

Figure 20:
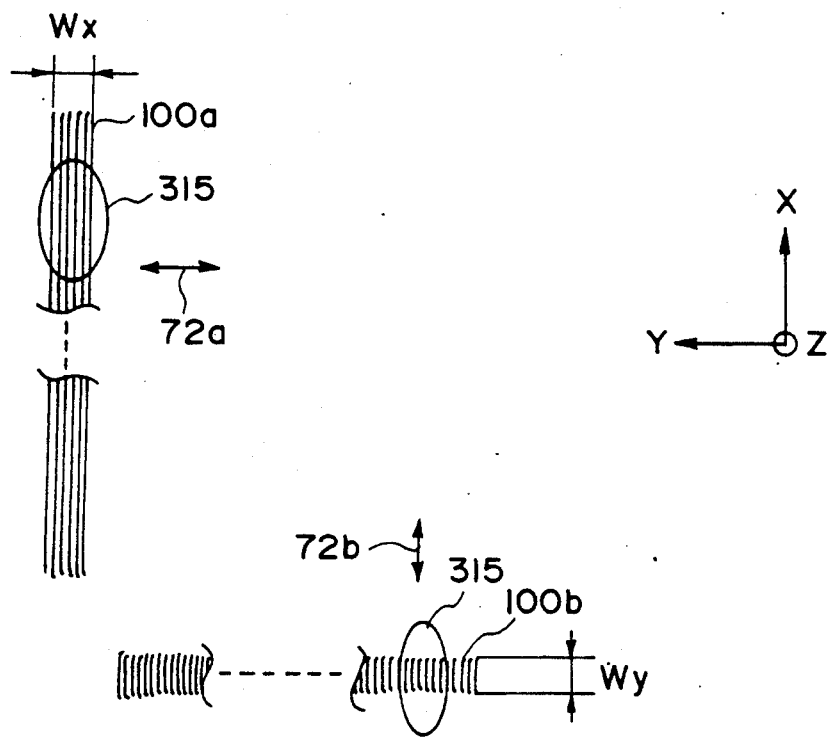
FIG. 20 is a schematic representation, for explaining the relationship between the reference mark and the light.

A specific numerical example will now be explained. The alignment pattern on the scribe line 82 has a size of $50 \times 200$ (micron); the size of the light 315 is $120 \times 400$ (micron); the angle of incidence is $\theta i = 17$ (deg); and the reference mark 100 comprising a straight diffraction grating has a grating pitch $P = 3$ (micron). When second order diffraction light (diffracted with an angle of 13.16 deg. with respect to a normal to the mask) is detected by the sensor 311 or 131, in the case where the size of each of the marks 100a and 100b in FIG. 20 is $Wx = Wy = 30$ (micron), the light position detecting precision is 1 micron.

Accordingly, in this case, the position of incidence of the light upon the alignment pattern 83 can be set with a precision of about 1 micron.

While in the present embodiment a straight diffraction grating is used as the reference mark 100, the mark is not limited thereto. For example, the reference mark 100 may be provided by marks 101a and 101b each comprising a curved diffraction grating, such as shown in FIG. 22.

Figure 22:
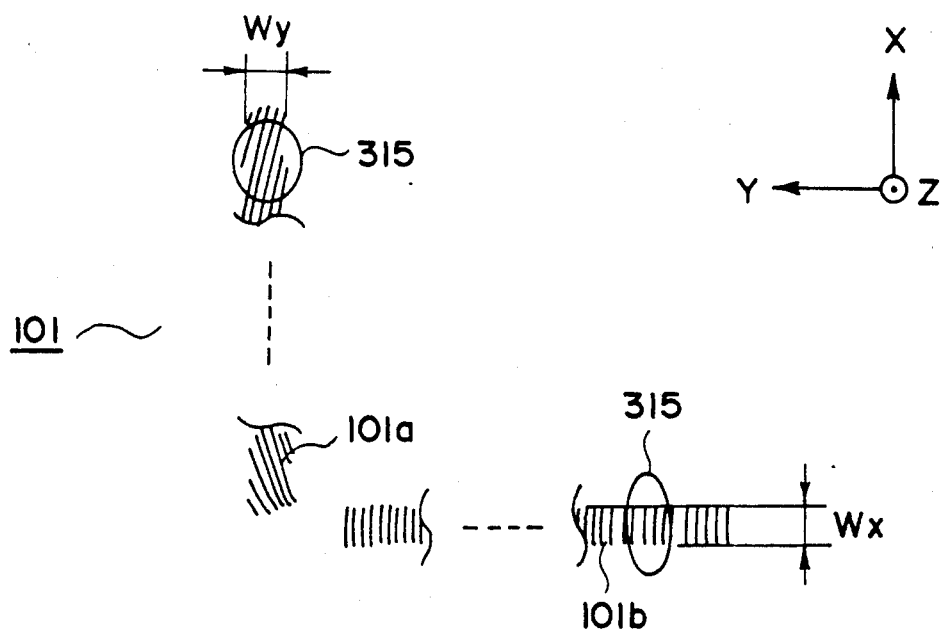
FIGS. 22 and 23 are schematic representations, respectively, for explaining another form of a reference mark of the present invention and the manner of light convergence when the reference mark of this form is used.
Figure 23:
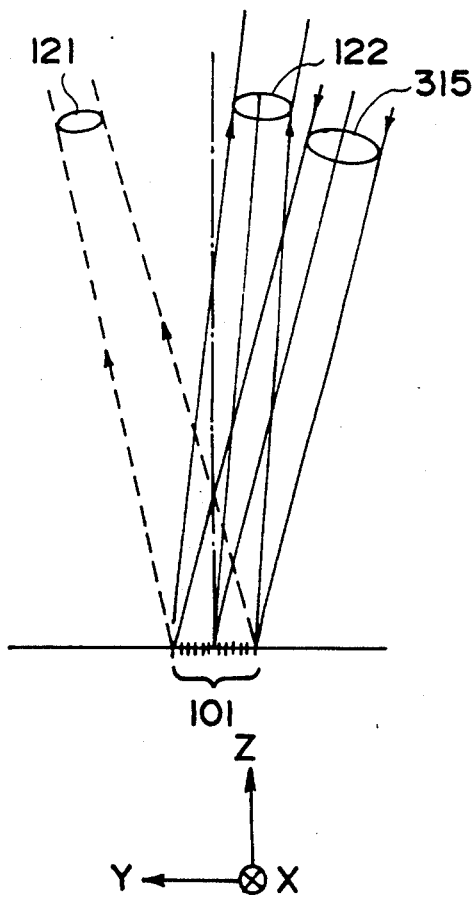

FIG. 23 illustrates the reference mark 101 of FIG. 22, in the Y-Z plane. In the drawing, denoted at 315 is input light, denoted at 121 is zero-th order reflective diffraction light and denoted at 122 is first order reflective diffraction light. When the diffracting grating is provided by a curved grating, as in this embodiment, the diffraction light can be refracted in the same manner as by a lens and, therefore, it is possible to make smaller the size of the light spot by the diffraction light, as compared with that by diffraction light from a straight grating. As a result, further enhancement of the detection precision is attainable.

Further, the reference mark may be provided on a wafer stage, for detection of the position of the pickup head 16.

In the embodiments described hereinbefore, the present invention has been explained with reference to examples wherein the invention is applied to a proximity type exposure apparatus. However, the present invention is applicable also to a projection exposure apparatus using a projection lens system or a projection mirror system. Additionally, the present invention is applicable to other types of apparatuses or instruments in which high-precision alignment is required.

While the invention has been described with reference to the structures disclosed herein, it is not confined to the details set forth and this application is intended to cover such modifications or changes as may come within the purposes of the improvements or the scope of the following claims.

What is claimed is:

1. In a method of detecting a position of a substrate having a alignment mark with an optical power, wherein a radiation beam is projected from an optical head to the alignment mark such that the alignment mark produces a signal beam on the basis of which the position of the substrate is detected, the improvements residing in:

forming a reference mark on the substrate at a position different form that of the alignment mark;

projecting a radiation beam from the optical head to the reference mark, such that the reference mark produces a reference beam;

detecting the relative positional deviation of the optical head relative to the reference mark on the basis of the produced reference beam; and adjusting the relative position of the optical head and the alignment mark on the basis of the detected relative positional deviation and, after the adjustment, detecting the position of the substrate on the basis of the produced signal beam.

2. A method according to claim 1, wherein the alignment mark comprises a first zone plate pattern, and wherein said method further comprises the steps of projecting the radiation beam to the first zone plate pattern so as to produce a signal beam with which a light pattern is formed on a plane, and detecting the position of the substrate on the basis of the position of the light pattern upon said plane.

3. A method according to claim 2, further comprising the steps of disposing a first substrate which is said substrate opposed to a second substrate having a second zone plate pattern, projecting the radiation beam to the first zone plate pattern to produce a diffraction beam which is diffracted again by the second zone plate pattern, whereby the signal beam is produced with which the light pattern is formed on said plane, and detecting the position of the first substrate relative to the second substrate, with respect to a direction substantially parallel to the first and second substrates, on the basis of the position of the light pattern on said plane.

4. A method according to claim 2, further comprising the steps of disposing a first substrate which is said substrate opposed to a second substrate, projecting the radiation beam to the second substrate to produce a reflection beam which is diffracted by the first zone plate pattern to produce the signal beam, by which the light pattern is formed on said plane, and detecting the position of the first substrate relative to the second substrate with respect to a direction substantially perpendicular to the first and second substrates, on the basis of the position of the light pattern upon said plane.

5. A method according to claim 1, further comprising the step of, after the detection of the positional deviation of the optical head in said detecting step, moving the optical head without affecting the alignment between the optical head and the reference mark, so as to align the optical head and the alignment mark with each other.

6. A method according to claim 5, wherein the reference mark comprises a diffraction grating pattern, wherein said method further comprises the steps of projecting the radiation beam to the diffraction grating pattern to produce the reference beam and detecting the position of the optical head by detecting an intensity distribution of the reference beam.

7. A method according to claim 6, wherein the diffraction grating pattern has a size larger than a beam pattern as formed by the radiation beam on the substrate, and comprises an array of grating marks having grating lines extending in different directions, and wherein said method further comprises the steps of projecting portions of the radiation beam to corresponding ones of the grating marks, whereby plural diffraction beams are produced by the marks, and detecting and comparing the intensities of the diffraction beams and, on the basis of the comparison, detecting the position of the optical head.

8. A method according to claim 6, wherein the alignment mark comprises a first zone plate pattern, and wherein, said method further comprises the steps of detecting the position of the substrate, by projecting the radiation beam to the first zone plate pattern so as to produce a signal beam with which a light pattern is formed on a plane, and detecting the position of the substrate on the basis of the position of the light pattern upon said plane.

9. A method according to claim 8, wherein further comprises the steps of disposing a first substrate which is said substrate opposed to a second substrate having a second zone plate pattern, projecting the radiation beam to the first zone plate pattern to produce a diffraction beam which is diffracted again by the second zone plate pattern, whereby the signal beam is produced with which the light pattern is formed on said plane, and detecting the position of the first substrate relative to the second substrate, with respect to a direction substantially parallel to the first and second substrates, on the basis of the position of the light pattern on said plane.

10. A method according to claim 8, wherein further comprising the steps of disposing a first substrate which is said substrate opposed to a second substrate, projecting the radiation beam to the second substrate to produce a reflection beam which is diffracted by the first zone plate pattern to produce the signal beam, by which the light pattern is formed on said plane, and detecting the position of the first substrate relative to the second substrate with respect to a direction substantially perpendicular to the first and second substrates, on the basis of the position of the light image upon said plane.

11. A method according to claim 5, wherein the reference mark comprises a diffraction grating pattern, wherein said method further comprises the step of scanning the diffraction grating pattern with the radiation beam to produce the reference beam and detecting the position of the optical head by detecting an intensity of the reference beams, wherein the diffraction grating pattern comprises a pattern extending in a first direction and having a size in a second direction, substantially perpendicular to the first direction, which size is not greater than the size of a beam spot in the second direction as formed by the radiation beam on the substrate, and wherein said method further comprises the steps of scanning the grating pattern with the radiation beam along the second direction.

12. A method according to claim 5, wherein the alignment mark comprises a first zone plate pattern, and wherein said method further comprises the steps of detecting, the position of the substrate, by projecting the radiation beam to the first zone plate pattern so as to produce a signal beam with which a light pattern is formed on a plane, and detecting the position of the substrate on the basis of the position of the light pattern upon said plane.

13. A method according to claim 12, further comprising the steps of disposing a first substrate which is said substrate opposed to a second substrate having a second zone plate pattern, projecting the radiation beam to the first zone plate pattern to produce a diffraction beam which is diffracted again by the second zone plate pattern, whereby the signal beam is produced with which the light pattern is formed on said plane, and detecting the position of the first substrate relative to the second substrate, with respect to a direction substantially parallel to the first and second substrates, on the basis of the position of the light pattern on said plane.

14. A method according to claim 12, further comprising the steps of disposing a first substrate which is said substrate opposed to a second substrate projecting the radiation beam to the second substrate to produce a reflection beam which is diffracted by the first zone plate pattern to produce the signal beam, by which the light pattern is formed on said plane, and detecting the position of the first substrate relative to the second substrate with respect to a direction substantially perpendicular to the first and second substrates, on the basis of the position of the light pattern upon said plane.

15. A device for detecting a position of a substrate having a alignment mark with an optical power and a reference mark formed at different positions thereon, said device comprising:

an optical head movable along the substrate, for projecting a radiation beam to the substrate and for receiving the radiation beam from the substrate; and control means for controlling said optical head and for detecting the position of the substrate on the basis of a signal from said optical head;

wherein said control means is operable to cause said optical head to project a radiation beam to the reference mark of the substrate and also to cause said optical head to photoelectrically detect the radiation beam from the reference mark, whereby said optical head produces a first signal;

wherein said control means is further operable to determine the relative positional deviation of said optical head relative to the reference mark of the substrate on the basis of the first signal from said optical head and also to move said optical head relative to the substrate in accordance with the determination so as to align said optical head with the alignment mark of the substrate;

wherein said control means is further operable to cause said optical head to project a radiation beam to the alignment mark of the substrate and also to cause said optical head to photoelectrically detect the radiation beam from the alignment mark of the substrate, whereby said optical head produces a second signal; and wherein said control means is further operable to determine the position of the substrate on the basis of the second signal from said optical head.

16. A method according to claim 15, wherein, after the detection of the positional deviation of said optical head, said optical head is moved without affecting the alignment between said optical head and the reference mark, so as to align said optical head and the alignment mark with each other.

17. An alignment and exposure apparatus usable with a mask having a circuit pattern and having a first alignment mark with an optical power and a reference mark formed at different positions thereon as well as a wafer having a second alignment mark with an optical power, for exposing the wafer to the circuit pattern of the mask with radiation, said apparatus comprising:

a first stage for holding the mask;

a second, movable stage for holding the wafer;

illumination means for illuminating the mask so that the wafer is exposed to the circuit pattern of the mask as illuminated;

an optical head movable along the mask, for projecting a radiation beam to the mask and for receiving the radiation beam from the mask; and control means for controlling said optical head and second movable stage and for detecting the position of the wafer on the basis of a signal from said optical head;

wherein said control means is operable to cause said optical head to project a radiation beam to the reference mark of the mask and also to cause said optical head to photoelectrically detect a reflection beam from the reference mark, whereby said optical head produces a first signal;

wherein said control means is further operable to determine the relative positional deviation of said optical head relative to the reference mark of the mask on the basis of the first signal from said optical head and also to move said optical head relative to the mask in accordance with the determination so as to align said optical head with the first alignment mark of the marks;

wherein said control means is further operable to cause said optical head to project a radiation beam to the first and second alignment marks of the mask and the wafer and also to cause said optical head to photoelectrically detect a signal beam from the first and second alignment marks, whereby said optical head produces a second signal;

wherein said control means is further operable to determine the relative position of the wafer relative to the mask on the basis of the second signal from said optical head; and wherein said control means is further operable to move said second movable stage in accordance with the determination of the relative position of the wafer, so as to align the wafer with respect to the mask.

18. A method according to claim 17, wherein, after the detection of the positional deviation of said optical head, said optical head is moved without affecting the alignment between said optical head and the reference mark, so as to align said optical head and the alignment mark with each other.

19. A method usable with a mask having a circuit pattern and a first alignment mark with an optical power as well as a wafer having a second alignment mark with an optical power, for manufacturing semiconductor devices, by using an optical head, comprising:

forming a reference mark on the mask at a position different from that of the first alignment mark;

projecting from the optical head a radiation beam to the reference mark of the mask, such that the reference mark produces a reference beam;

detecting the relative positional deviation of the optical head relative to the reference mark of the mask on the basis of the produced reference beam;

adjusting the relative position of the optical head and the first alignment mark of the mask on the basis of the detection of the relative positional deviation;

projecting from the optical head a radiation beam to the first and second alignment marks of the mask and the wafer, such that the first and second alignment marks produce a signal beam;

detecting the relative positional deviation of the mask and the wafer on the basis of the produced signal beam;

adjusting the relative position of the mask and the wafer on the basis of the detected relative positional deviation of the mask and the wafer; and exposing the wafer to the circuit pattern of the mask with radiation energy.

20. A method according to claim 19, further comprising the step of after the detection of the positional deviation of the optical head, moving the optical head without affecting the alignment between the optical head and the reference mark, so as to align the optical head and the alignment mark with each other.

21. In a method of detecting a mark of a substrate which mark has an optical power, wherein a radiation beam is projected from an optical head to the substrate such that the substrate produces a signal beam indicative of the mark, the improvements residing in:

providing a reference mark on the substrate;

projecting a radiation beam from the optical head to the reference mark, such that the reference mark produces a reference beam;

detecting a relative positional deviation of the optical head relative to the reference mark on the basis of the produced reference beam; and adjusting the relative position of the optical head and the substrate on the basis of the detected relative positional deviation and, after the adjustment, detecting the mark to be detected, with the produced signal beam.

* * * * *

UNITED STATES PATENT AND TRADEMARK OFFICE
CERTIFICATE OF CORRECTION

PATENT NO. : 5,200,800  
DATED : April 6, 1993  
INVENTOR(S) : Shigeyuki Suda, et al.

Page 1 of 2

It is certified that error appears in the above-indentified patent and that said Letters Patent is hereby corrected as shown below:

On The Cover Page at [56]
"0358425 9/1989 European Pat. Off." should read --0358425 3/1990 Euro. Pat. Off.--.

Column 1
line 44, "No. 4.311.389" should read --No. 4,311,389--.

Column 3
line 36, "accordingly" should read --accordingly,--.

Column 8
line 21, "pickup," should read --pickup--.

Column 9
line 67, "preferably" should read --preferably be--.

Column 12
line 52, "cases" should read --case--.

UNITED STATES PATENT AND TRADEMARK OFFICE
CERTIFICATE OF CORRECTION

PATENT NO. : 5,200,800
DATED : April 6, 1993
INVENTOR(S) : Shigeyuki Suda, et al.

It is certified that error appears in the above-indentified patent and that said Letters Patent is hereby corrected as shown below:

<u>Column 13</u>
    line 5, "in the," should be deleted.
    line 7, should read --effective to simplify the structure of the system since, by--.

<u>Column 16</u>
    line 49, "$e_2$" should read --$\beta_2$--.

<u>Column 21</u>
    line 36, "claim 5" should read --claim 5,--.

<u>Column 22</u>
    line 6, "substrate" should read --substrate,--.
    line 16, "a" (first occurrence) should read --an--.

Signed and Sealed this

Fifteenth Day of March, 1994

BRUCE LEHMAN

*Attest:*

*Attesting Officer*  *Commissioner of Patents and Trademarks*